United States Patent
Mangyo et al.

(10) Patent No.: US 6,781,903 B2
(45) Date of Patent: Aug. 24, 2004

(54) SEMICONDUCTOR MEMORY DEVICE WITH POWER CONSUMPTION REDUCED IN NON-DATA-ACCESS

(75) Inventors: Atsuo Mangyo, Hyogo (JP); Masaru Haraguchi, Hyogo (JP); Akira Yamazaki, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/409,593

(22) Filed: Apr. 9, 2003

(65) Prior Publication Data

US 2004/0081009 A1 Apr. 29, 2004

(30) Foreign Application Priority Data

Oct. 29, 2002 (JP) ........................................ 2002-314839

(51) Int. Cl.$^7$ .............................................. G11C 7/00
(52) U.S. Cl. ...................................... 365/203; 365/227
(58) Field of Search ................................ 365/227, 203

(56) References Cited

U.S. PATENT DOCUMENTS 4,460,979 A * 7/1984 Brahmbhatt ........... 365/185.08

FOREIGN PATENT DOCUMENTS

JP    8-203268    8/1996

* cited by examiner

*Primary Examiner*—M. Tran
(74) *Attorney, Agent, or Firm*—Burns, Doane, Swecker & Mathis, L.L.P.

(57) ABSTRACT

A semiconductor memory device includes a first data line electrically connected to selected one of a plurality of memory cells in response to activation of a word line, a second data line provided hierarchically with respect to the first data line, a read circuit provided between the first data line and the second data line to drive the second data line to a fixed voltage with a driving power according to a voltage on the first data line at the time of data reading, and a voltage supply control circuit for supplying a predetermined voltage to the second data line in response to a precharge/equalize instruction. The voltage supply control circuit includes a voltage supply stop circuit disconnecting the second data line from the predetermined voltage in a predetermined period except for the time of data reading.

9 Claims, 32 Drawing Sheets

SEMICONDUCTOR MEMORY DEVICE WITH POWER CONSUMPTION REDUCED IN NON-DATA-ACCESS

BACKGROUND OF THE INVENTION

1. Field of the Invention

The present invention relates to semiconductor memory devices and particularly to a semiconductor memory device operating in synchronization with an external clock.

2. Description of the Background Art

In the field of data processing for example, system LSI (Large Scale Integrated Circuit) has recently been in wide use. The system LSI has a memory device and a logic device such as microprocessor that are integrated on the same semiconductor chip for the purpose of achieving fast data processing with low power consumption. This system LSI has the following advantages as compared with the conventional system having individual memory and logic devices soldered onto a printed circuit board.

(1) The load on a signal line is smaller than that on the interconnection on the printed circuit board and thus fast data-signal-transmission is possible.

(2) There is no restriction on the number of pin terminals of the memory device and thus a data bus with a greater width can be provided between the memory device and the logic device to increase the data transfer rate.

(3) Components of the system LSI are integrated on the system LSI chip while the conventional configuration has individual components separately mounted on the printed circuit board, and thus the system LSI can be made compact and lightweight.

(4) Circuits having respective functions are arranged on the system LSI chip and thus the design efficiency is improved.

The system LSI which is advantageous as discussed above is accordingly in wide use in several fields. Examples of the memory device integrated in the system LSI are DRAM (Dynamic Random-Access Memory), SRAM (Static Random-Access Memory) and flash EEPROM (Electrically Erasable and Programmable Read-Only Memory). Examples of the integrated logic device of the system LSI are processor for control and processing and logic circuit such as A/D (Analog-to-Digital) conversion circuit for analog processing and dedicated logic processing.

Among the examples of the integrated memory device on the system LSI, DRAM is generally employed that achieves a greater capacity while keeping the same degree of integration as that of other memory devices.

FIG. 37 is a circuit diagram showing a configuration of a data read circuit 200 of separate IO type that is integrated in a DRAM.

Referring to FIG. 37, data read circuit 200 includes bit lines BL and /BL, read data lines /IOR and IOR, a bit line precharge/equalize circuit P/E, and a read gate RG electrically connecting read data lines /IOR and IOR each to a ground voltage GND in response to a signal on a read column selection line CSLR and the voltage level on bit lines BL and /BL. Here, binary states of signals and signal lines, i.e., high voltage state (power supply voltage Vcc) and low voltage state (ground voltage GND) are respectively referred to as "H level" and "L level."

Bit line precharge/equalize circuit P/E precharges/equalizes bit lines BL and /BL to an intermediate voltage VBL (Vcc/2) during an H-level period of a bit line equalize signal BLEQ.

Read gate RG includes N-channel MOS transistors TGc and TGe connected in series between read data line /IOR and ground voltage GND and N-channel MOS transistors TGd and TGf connected in series between read data line IOR and ground voltage GND.

N-channel MOS transistors TGe and TGf have respective gates connected to bit lines BL and /BL respectively. To respective gates of N-channel MOS transistors TGc and TGd, the signal on read column selection line CSLR is supplied.

Data read circuit 200 further includes a sense amplifier circuit SA amplifying a slight potential difference between bit lines BL and /BL, a preamplifier PA amplifying a slight potential difference between read data lines /IOR and IOR, and a read data line precharge/equalize circuit EQ.

Read data line precharge/equalize circuit EQ precharges/equalizes read data lines /IOR and IOR to power supply voltage Vcc during an L-level period of a read data line equalize signal /IOREQ.

In data read circuit 200, bit lines BL and /BL are precharged to the intermediate voltage VBL and read data lines /IOR and IOR are precharged to the power supply voltage Vcc even in a standby state and a self-refresh state in which no data is read from a desired memory cell (hereinafter also referred to as selected memory cell). Then, even if the signal on read column selection line CSLR has L level, respective drains of N-channel MOS transistors TGc and TGd are set at power supply voltage Vcc and respective sources of N-channel MOS transistors TGc and TGd are set at ground voltage GND. Accordingly, off leakage current flows between the drain and source of N-channel MOS transistors TGc and TGd each.

A technique of decreasing such an off leakage current of the transistors thereby reducing power consumption in a standby or self-refresh state of the DRAM is disclosed for example in Japanese Patent Laying-Open No. 8-203268, pp. 10–14 (hereinafter referred to as conventional art). This conventional art, however, cannot completely prevent the off leakage current from flowing.

For the above-discussed reason, the off leakage current of the transistors generally flows in the DRAM in a standby or self-refresh state. In particular, the system LSI having the integrated DRAM as a memory device generally includes several hundreds of IO lines. Accordingly, a greater off leakage current flows through the IO lines and thus it is likely that the power consumption in the standby or self-refresh state increases.

SUMMARY OF THE INVENTION

One object of the present invention is to provide a semiconductor memory device completely shutting off the off leakage current in the transistor provided between the data line and the bit line in a predetermined period in which no data access is executed and accordingly reducing power consumption.

In summary, according to one aspect of the present invention, a semiconductor memory device includes a plurality of memory cells, a first data line electrically connected to selected one of the memory cells in response to activation of a word line, a second data line hierarchically provided with respect to the first data line, a read circuit provided between the first data line and the second data line to drive the second data line to a fixed voltage with a driving power according to a voltage on the first data line at the time of data reading, and a voltage supply control circuit for supplying a predetermined voltage to the second data line in response to a precharge/equalize instruction. The voltage supply control circuit includes a voltage supply stop circuit disconnecting the second data line from the predetermined voltage in a predetermined period except for the time of data reading.

According to another aspect of the present invention, a semiconductor memory device includes a plurality of memory cells, a first data line electrically connected to selected one of the memory cells in response to activation of a word line, a second data line hierarchically provided with respect to the first data line, a switch circuit provided between the first data line and the second data line to electrically connect the first data line and the second data line at the time of data access, and a voltage supply control circuit for supplying a predetermined voltage to the second data line in response to a precharge/equalize instruction. The voltage supply control circuit includes a voltage supply stop circuit disconnecting the second data line from the predetermined voltage in a predetermined period except for the time of data access.

A chief advantage of the present invention is that a semiconductor memory device is achieved with the power consumption reduced by completely shutting off the off leakage current in the transistor provided between the first and second data lines in a predetermined period in which no data access is carried out.

According to still another aspect of the present invention, a semiconductor memory device includes a plurality of memory cells, a plurality of first data lines, a plurality of second data lines hierarchically provided with respect to the first data lines respectively, a plurality of read circuits respectively provided between the first data lines and the second data lines to drive the second data lines correspondingly respectively to the first data lines to a fixed voltage with a driving power according to respective voltages on the plurality of first data lines at the time of data reading, a power supply node supplying a predetermined voltage, a voltage supply line, a voltage supply stop circuit provided between said power supply node and said voltage supply line to electrically connect said power supply node and said voltage supply line at the time of data reading, and a plurality of voltage supply control circuits provided correspondingly to the second data lines respectively for electrically connecting the voltage supply line and the second data lines in response to a precharge/equalize instruction, the voltage supply stop circuit disconnecting the power supply node from the voltage supply line in a predetermined period except for the time of data reading. Selected one of the first data lines is electrically connected to selected one of the memory cells in response to activation of a word line.

Another advantage of the present invention is that a semiconductor memory device is achieved with the power consumption reduced by controlling supply of the voltage from one power supply node to a plurality of voltage supply control circuits.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
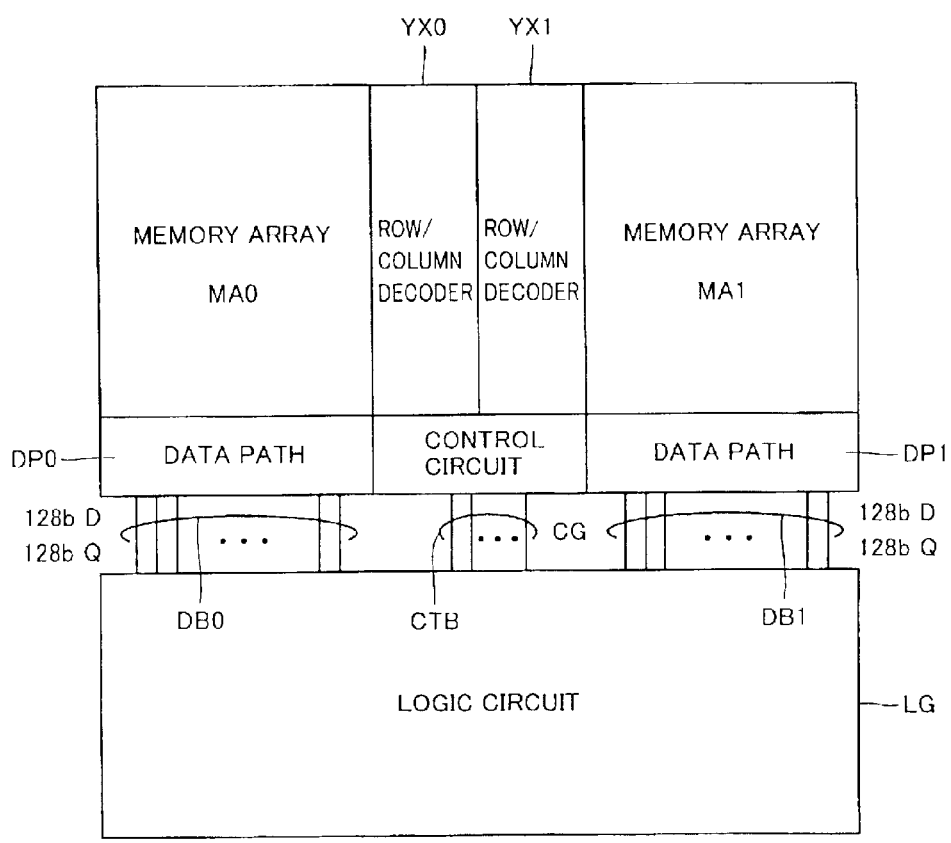
FIG. 1 schematically shows an exemplary configuration of a DRAM-contained system LSI.

Embodiments of the present invention are hereinafter described in conjunction with the drawings in which the same components are denoted by the same reference characters.

First Embodiment

Referring to FIG. 1, a system LSI 1000 includes memory arrays MA0 and MA1 each having a plurality of memory cells arranged in rows and columns, and row/column decoders YX0 and YX1 provided correspondingly to respective memory arrays MA0 and MA1 for selecting an addressed row/column of corresponding memory arrays MA0 and MA1. It is noted that memory arrays MA0 and MA1 are herein collectively referred to as memory array MA and row/column decoders YX0 and YX1 are herein collectively referred to as row/column decoder YX in some cases.

System LSI 1000 further includes data paths DP0 and DP1 provided correspondingly to respective memory arrays MA0 and MA1 for supplying/receiving data to/from a memory cell column selected by row/column decoders YX0 and YX1, a control circuit CG for controlling data access to memory arrays MA0 and MA1, and a logic circuit LG.

Data paths DP0 and DP1 are connected via data buses DB0 and DB1 respectively to logic circuit LG. Control circuit CG is connected via a control bus CTB to logic circuit LG. Data buses DB0 and DB1 in FIG. 1 each transmit write data (D) of 128 bits and read data (Q) of 128 bits separately between corresponding data paths DP0 and DP1 and logic circuit LG.

Figure 2:
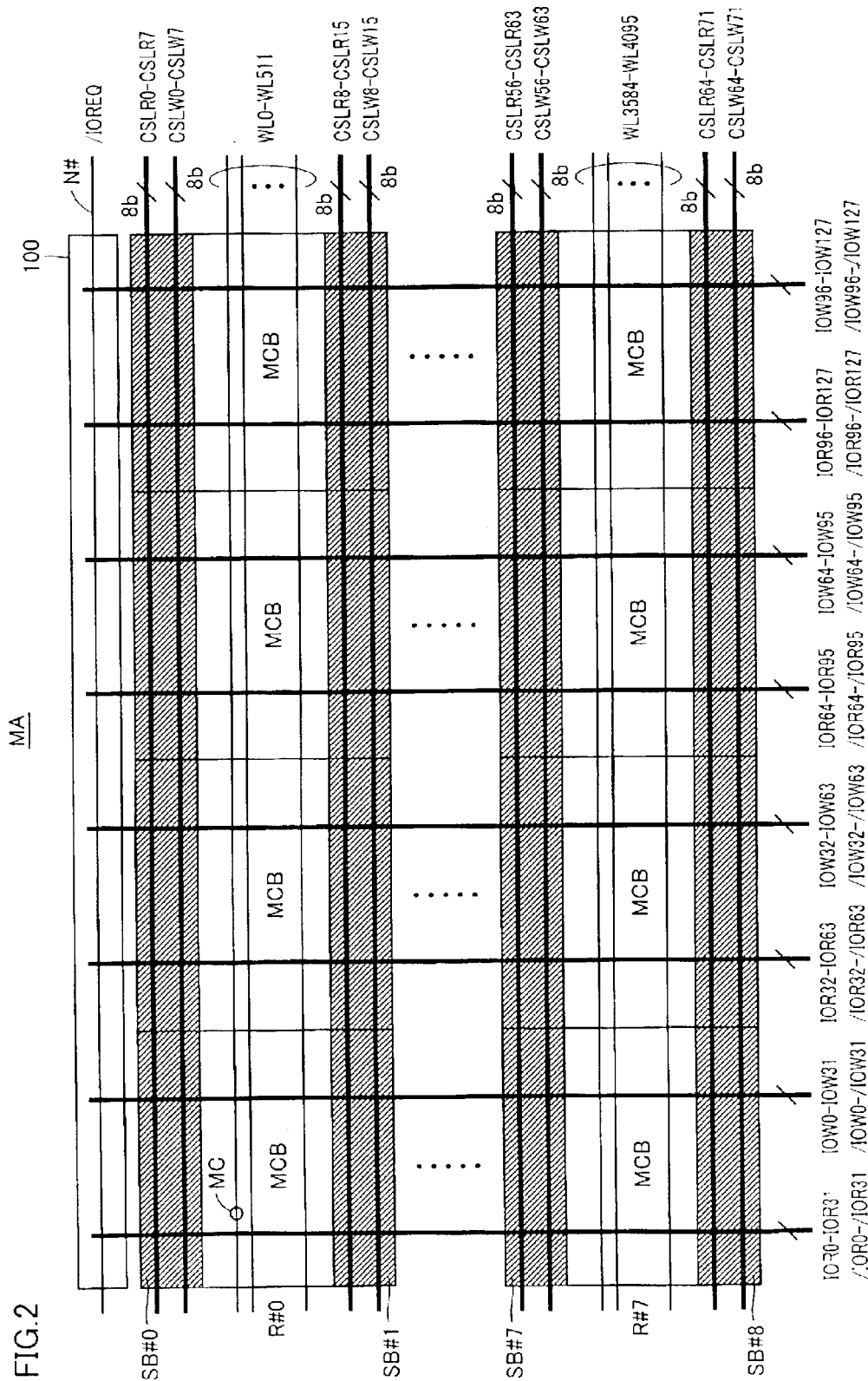
FIG. 2 schematically shows a configuration of a memory array of separate IO type.

Referring to FIG. 2, memory array MA includes eight row blocks R#0–R#7 arranged in the column direction. Row blocks R#0–R#7 each include four memory cell blocks MCB arranged in the row direction. Memory cell blocks MCB each have memory cells MC. FIG. 2 representatively shows one memory cell MC, however, actually a plurality of similar memory cells MC are arranged in rows and columns for each bit line (not shown) and for each word line in each memory cell block MCB. Memory cell MC is hereinafter simply referred to as memory cell in some cases.

Memory array MA further includes sense amplifier bands SB#0–SB#8. Sense amplifier bands SB#0–SB#7 are arranged in FIG. 2 on the upper side in the column direction of respective row blocks R#0–R#7, and sense amplifier band SB#8 is placed on the lower side in the column direction of row block R#7.

Moreover, memory array MA includes a read column selection line CSLR of 8 bits and a write column selection line CSLW of 8 bits that are arranged in each of sense amplifier bands SB#0–SB#8. Memory array MA thus includes 72 read column selection lines CSLR0–CSLR71 and 72 write column selection lines CSLW0–CSLW71 arranged in memory array MA.

Memory array MA further includes 512 word lines WLs arranged in row direction in each of row blocks R#0–R#7.

In addition, memory array MA includes read data lines IOR0–IOR127, read data lines /IOR0–/IOR127, write data lines IOW0–IOW127 and write data lines /IOW0–/IOW127.

Read data lines IOR0–IOR127, read data lines /IOR0–/IOR127, write data lines IOW0–IOW127 and write data lines /IOW0–/IOW127 are each arranged correspondingly to those memory cell blocks MCB aligned in the column direction, 32 lines being provided for the memory cell blocks MCB arranged in the column.

Read column selection lines CSLR0–CSLR71, write column selection lines CSLW0–CSLW71, sense amplifier bands SB#0–SB#8, read data lines /IOR0–/IOR127, read data lines IOR0–IOR127, write data lines /IOW0–/IOR127 and write data lines IOW0–IOW127 may hereinafter be referred to collectively as read column selection line CSLR, write column selection line CSLW, sense amplifier band SB#, read data lines /IOR and IOR, and write data lines /IOW and IOW.

In addition, when reference is made to specific read column selection line CSLR, write column selection line CSLW, sense amplifier band SB#, read data lines /IOR and IOR, write data lines /IOW and IOR, and word line WL, a numerical subscript is attached to these reference characters each, for example, read column selection line CSLR1, write column selection line CSLW1, sense amplifier band SB#1, read data lines /IOR1 and IOR1, write data lines /IOW1 and IOW1 and word line WL1.

Memory array MA additionally includes a group of equalize circuits 100. The group of equalize circuits 100 includes a read data line precharge/equalize circuit (not shown) that is provided correspondingly to one-ends of 32 read data lines /IOR and 32 read data lines IOR.

Memory array MA further includes a node N# provided in the row direction of the group of equalize circuits 100. Node N# transmits a read data line equalize signal /IOREQ for equalizing/precharging read data lines /IOR and IOR and write data lines /IOW and IOW each.

Figure 3:
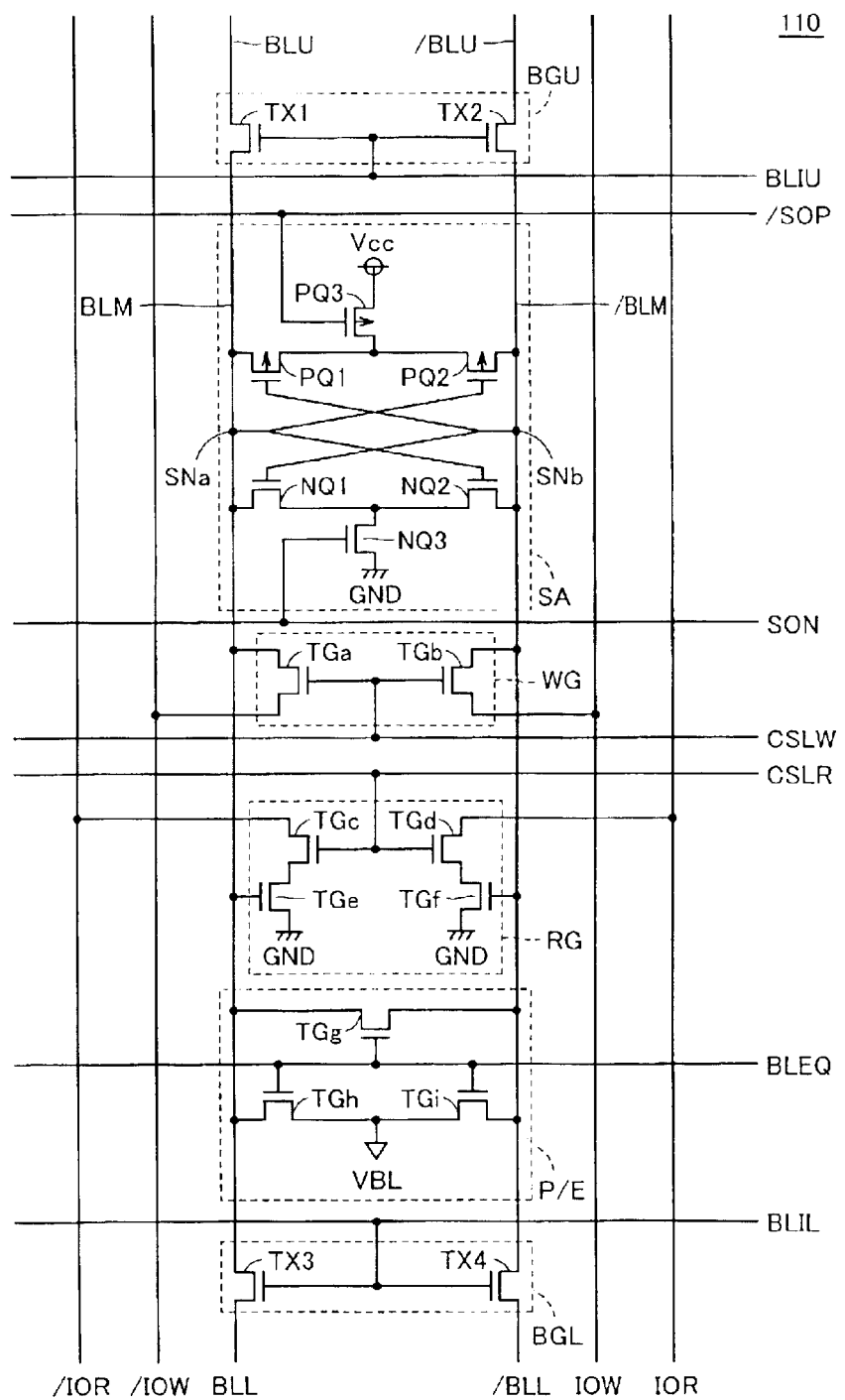
FIG. 3 is a circuit diagram showing a configuration of a sense amplifier structure circuit of separate IO type in a sense amplifier band shown in FIG. 2 according to a first embodiment.

Referring to FIG. 3, a sense amplifier structure circuit 110 includes a bit line separation gate BGU, a bit line separation gate BGL, a sense amplifier circuit SA, a write gate WG, a read gate RG, a precharge/equalize circuit P/E, a read column selection line CSLR and a write column selection line CSLW.

Sense amplifier circuit SA is provided between bit lines BLM and /BLM. By the operation of bit line separation gate BGU, sense amplifier circuit SA is electrically connected to bit lines BLU and /BLU in the memory cell block located on the upper side thereof in FIG. 3. Further, by the operation of bit line separation gate BGL, sense amplifier circuit SA is further connected electrically to bit lines BLL and /BLL of the memory cell block located on the lower side thereof in FIG. 3.

Sense amplifier circuit SA includes P-channel MOS transistors PQ1, PQ2 and PQ3, and N-channel MOS transistors NQ1, NQ2 and NQ3. P-channel MOS transistors PQ1 and PQ2 are connected in series between bit line BLM and bit line /BLM. Respective gates of P-channel MOS transistors PQ1 and PQ2 are connected respectively to sense nodes SNb and SNa. P-channel MOS transistor PQ3 is provided between power supply voltage Vcc and a connection node of P-channel MOS transistors PQ1 and PQ2. P-channel MOS transistor PQ3 has its gate to which sense amplifier activation signal /SOP is supplied.

N-channel MOS transistors NQ1 and NQ2 are connected in series between bit lines BLM and /BLM. Respective gates of N-channel MOS transistors NQ1 and NQ2 are connected respectively to sense nodes SNb and SNa. N-channel MOS transistor NQ3 is provided between a connection node of N-channel MOS transistors NQ1 and NQ2 and ground voltage GND. Sense amplifier activation signal SON is supplied to the gate of N-channel MOS transistor NQ3. Sense amplifier activation signals /SOP and SON are complementary to each other.

Sense amplifier circuit SA serves to detect, amplify and latch data in a selected memory cell by sense nodes SNa and SNb in response to sense amplifier activation signals /SOP and SON that are complementary to each other.

Bit line separation gate BGU includes N-channel MOS transistors TX1 and TX2. N-channel MOS transistor TX1 is provided between bit lines BLU and BLM. N-channel MOS transistor TX2 is provided between bit lines /BLU and /BLM. To respective gates of N-channel MOS transistors TX1 and TX2, bit line separation instruction signal BLIU is supplied. Then, in response to bit line separation instruction signal BLIU at H level, bit line separation gate BGU electrically connects bit line BLU and bit line BLM and connects bit line /BLU and bit line /BLM.

Bit line separation gate BGL includes N-channel MOS transistors TX3 and TX4. N-channel MOS transistor TX3 is provided between bit line BLM and bit line BLL. N-channel MOS transistor TX4 is provided between bit line /BLM and bit line /BLL. To respective gates of N-channel MOS transistors TX3 and TX4, bit line separation instruction signal BLIL is supplied. Accordingly, in response to bit line separation instruction signal BLIL at H level, bit line separation gate BGL electrically connects bit lines BLM and /BLM respectively to bit lines BLL and /BLL.

Write gate WG includes transfer gates TGa and TGb. Respective sources of transfer gates TGa and TGb are connected respectively to bit lines BLM and /BLM. Respective drains of transfer gates TGa and TGb are connected respectively to write data lines /IOW and IOW. A signal on write column selection line CSLW is supplied to the gates of transfer gates TGa and TGb. Thus, in response to the signal on write column selection line CSLW, write gate WG electrically connects write data lines /IOW and IOW respectively to sense nodes SNb and SNa.

Read gate RG includes N-channel MOS transistors TGc and TGe connected in series between read data line /IOR and ground voltage GND, and N-channel MOS transistors TGd and TGf connected in series between read data line IOR and ground voltage GND. To respective gates of N-channel MOS transistors TGc and TGd, a signal on read column selection line CSLR is supplied. Respective gates of N-channel MOS transistors TGe and TGf are connected respectively to bit lines BLM and /BLM.

In response to the potential of the signal on read column selection line CSLR and on sense nodes SNa and SNb, read gate RG turns on one of N-channel MOS transistors TGc and TGe or one of N-channel MOS transistors TGd and TGf to set one of read data lines /IOR and IOR at ground voltage GND.

Precharge/equalize circuit P/E includes N-channel MOS transistors TGg, TGh and TGi. N-channel MOS transistor TGg is provided between bit line BLM and bit line /BLM. N-channel MOS transistors TGh and TGi are connected in series between bit line BLM and bit line /BLM. N-channel MOS transistors TGg, TGh and TGi have respective gates to which bit line equalize signal BLEQ is supplied. To a connection node of N-channel MOS transistors TGh and TGi, an intermediate voltage VBL (=Vcc/2) is supplied.

Thus, in response to bit line equalize signal BLEQ, precharge/equalize circuit P/E precharges and equalizes sense nodes SNa and SNb connected to bit lines BLM and /BLM to intermediate voltage VBL.

In reading data from a selected memory cell, bit line separation instruction signals BLIU and BLIL are supplied respectively to bit line separation gates BGU and BGL. Bit lines BLU, BLM and BLL are electrically connected, and bit lines /BLU, /BLM and /BLL are electrically connected. Accordingly, only the memory cell block MCB including the selected memory cell is electrically connected to sense amplifier circuit SA. Data of the selected memory cell is amplified by sense amplifier circuit SA and thus read gate RG causes a potential difference between read data lines /IOR and IOR. The potential difference between read data lines /IOR and IOR is amplified by a preamplifier (not shown) and supplied to any external circuit as data.

In writing data into a selected memory cell, write gate WG electrically connects write data lines /IOW and IOW respectively to bit lines BLM and /BLM. In a similar manner to that in the data reading, in response to bit line separation instruction signals BLIU and BLIL, bit lines BLU, BLM and BLL are electrically connected and bit lines /BLU, /BLM and /BLL are electrically connected. Thus, bit lines BLM and /BLM are connected electrically to the selected memory cell. Accordingly, the data supplied to write data lines /IOW and IOW is written into the selected memory cell via the bit lines.

Figure 4:
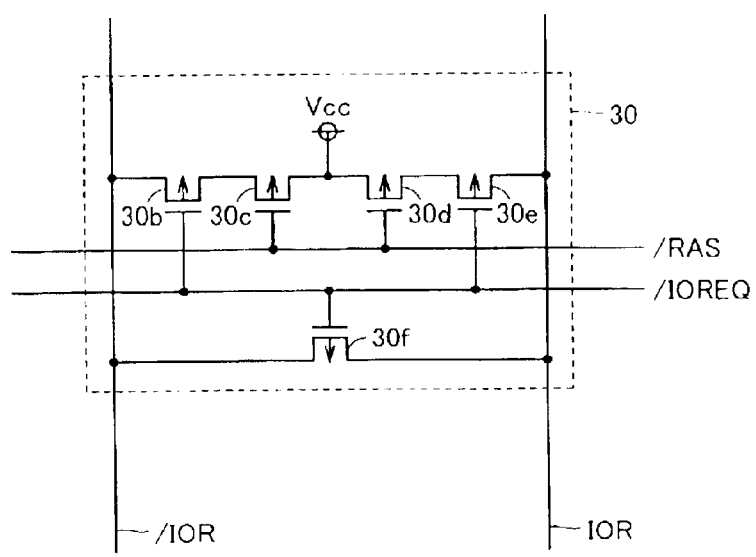
FIG. 4 is a circuit diagram showing a configuration of a read data line precharge/equalize circuit of separate IO type in a memory array according to the first embodiment.

Referring to FIG. 4, read data line precharge/equalize circuit 30 includes P-channel MOS transistors 30b, 30c, 30d and 30e connected in series between read data line/IOR and read data line IOR, and a P-channel MOS transistor 30f connected between read data line /IOR and read data line IOR. To respective gates of P-channel MOS transistors 30b, 30e and 30f, read data line equalize signal /IOREQ is supplied. To respective gates of P-channel MOS transistors 30c and 30d, row address strobe signal /RAS is supplied. To the connection node of P-channel MOS transistors 30c and 30d, power supply voltage Vcc is supplied.

Thus, in response to read data line equalize signal /IOREQ at L level, read data line precharge/equalize circuit 30 equalizes read data lines /IOR and IOR. Further, read data line precharge/equalize circuit 30 precharges read data lines /IOR and IOR to power supply voltage Vcc in response to read data line equalize signal /IOREQ at L level and row address strobe signal /RAS at L level.

On the other hand, read data line precharge/equalize circuit 30 cancels the precharging of read data lines /IOR and IOR in response to row address strobe signal /RAS at H level. Moreover, read data line precharge/equalize circuit 30 cancels the equalization and precharging of read data lines /IOR and IOR in response to read data line equalize signal /IOREQ at H level. In other words, read data line precharge/equalize circuit 30 operates as a voltage supply control circuit controlling supply of a predetermined voltage to read data lines /IOR and IOR in response to control signals such as read data line equalize signal /IOREQ and row address strobe signal /RAS.

In general, in reading data from a selected memory cell, it is necessary to amplify a slight potential difference generated between read data lines /IOR and IOR by a preamplifier (not shown). Then, except for the time when data is read from a selected memory cell, read data lines /IOR and IOR should be equalized and precharged all the time. Namely, read data line equalize signal /IOREQ is constantly kept at L level except for the time of reading data from a selected memory cell.

Figure 5:
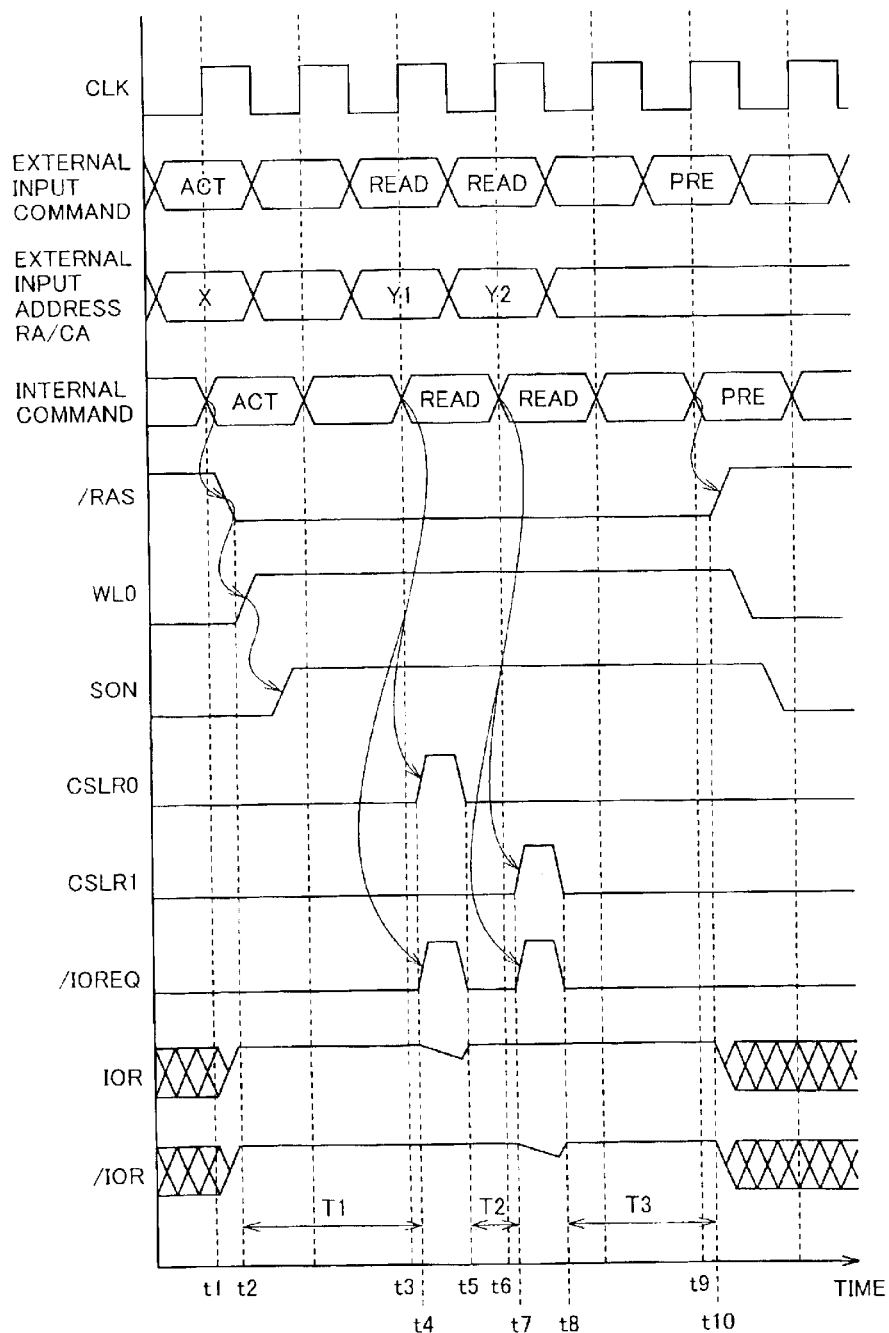
FIG. 5 is an operational waveform chart illustrating a data reading operation by a sense amplifier structure circuit and a read data line precharge/equalize circuit in the memory array according to the first embodiment.

Referring to FIG. 5, external input commands ACT, READ and PRE are set to internal commands ACT, READ and PRE in synchronization with clock signal CLK.

Internal command ACT allows a row address signal to be input. Internal command PRE allows a row address signal not to be input. At time t1, internal command ACT is issued and, at time t2, row address strobe signal /RAS is set at L level. In data reading, read data line equalize signal /IOREQ is set at L level and thus precharging of read data lines /IOR and IOR is started by an operation of read data line precharge/equalize circuit 30. After this, in response to external input address signal X, word line WL0 is selected and set at H level. Word line WL0 is thus selected and accordingly sense amplifier activation signal SON is set at H level to activate sense amplifier circuit SA.

At time t3, external input address signal Y1 is supplied to row/column decoder YX in system LSI 1000. Read data line equalize signal /IOREQ which has been set at L level at time t4 is set at H level. Then, read data line precharge/equalize circuit 30 operates to cancel equalization and precharging of read data lines /IOR and IOR. At the same time, the signal on read column selection line CSLR0 that corresponds to external input address signal Y1 is set at H level. Thus, sense amplifier circuit SA connected to read column selection line CSLR0 operates to amplify a slight potential difference of a selected memory cell and data in the selected memory cell is output from read data lines /IOR and IOR.

After this, at time t5, read data line equalize signal /IOREQ and the signal on read column selection line CSLR0 is set at L level. Then, read data line precharge/equalize circuit 30 connected to read column selection line CSLR0 operates to equalize and precharge read data lines /IOR and IOR again.

At time t6, external input address signal Y2 is supplied to row/column decoder YX in system LSI 1000. Then, read data line equalize signal /IOREQ set at L level in the period from time t5 to time t7 is set at H level. Accordingly, equalization and precharging of read data lines /IOR and IOR are canceled again. Simultaneously, a signal on read column selection line CSLR1 that corresponds to external input address signal Y2 is set at H level. Then, sense amplifier circuit SA connected to read column selection line CSLR1 operates to output data in a selected memory cell.

After this, at time t8, read data line equalize signal /IOREQ and the signal on read column selection line CSLR1 are set at L level. Read data line precharge/equalize circuit 30 connected to read column selection line CSLR0 then operates to equalize and precharge read data lines /IOR and IOR again. Then, at time t9, internal command PRE is issued and row address strobe signal /RAS which set at L level in the period from time t2 to t10 is set at H level.

The periods T1, T2 and T3 thus correspond to the equalize and precharge periods for read data lines /IOR and IOR. In any period except for periods T1, T2 and T3 in which read data line equalize signal /IOREQ is set at H level, namely in the inactive period of read column selection line CSLR, read data line precharge/equalize circuit 30 operates to cancel equalization and precharging of read data lines /IOR and IOR corresponding to read column selection line CSLR.

Then, the charges on read data lines /IOR and IOR are released respectively via transistors TGc and TGe and transistors TGd and TGf in read gate RG. The charges on read data lines /IOR and IOR do not move and thus the off leakage current in transistors TGc and TGd in read gate RG is shut off.

In the period in which row address strobe signal /RAS is set at H level, namely in a self refresh period except for the period in which row address strobe signal /RAS is set at L level and in a standby period, read data line precharge/ equalize circuit 30 operates to cancel precharging of read data lines /IOR and IOR corresponding to read column selection line CSLR.

The charge on read data line /IOR and the charge on read data line IOR are thus released respectively via transistors TGc and TGe and transistors TGd and TGf in read gate RG. As a result, there occurs no movement of charge on read data lines /IOR and IOR and the off leakage current in transistors TGc and TGd in read gate RG is shut off.

It takes some time from the time when row address strobe signal /RAS is set at L level to the time when a desired read column selection line CSLR is selected. Then, in this period, read data lines /IOR and IOR may be equalized and precharged to allow data to be read from the selected memory cell appropriately.

As discussed above, in memory array MA of separate IO type according to the first embodiment, the charges on read data lines /IOR and IOR are released in the inactive period of read column selection line CSLR, particularly in the self refresh period except for the period in which row address strobe signal /RAS is set at L level and in the standby period, leakage current in transistors TGc and TGd in read gate RG is avoided. Consequently, the power consumption of the memory array, i.e., semiconductor memory device can be reduced.

First Modification of First Embodiment

Figure 6:
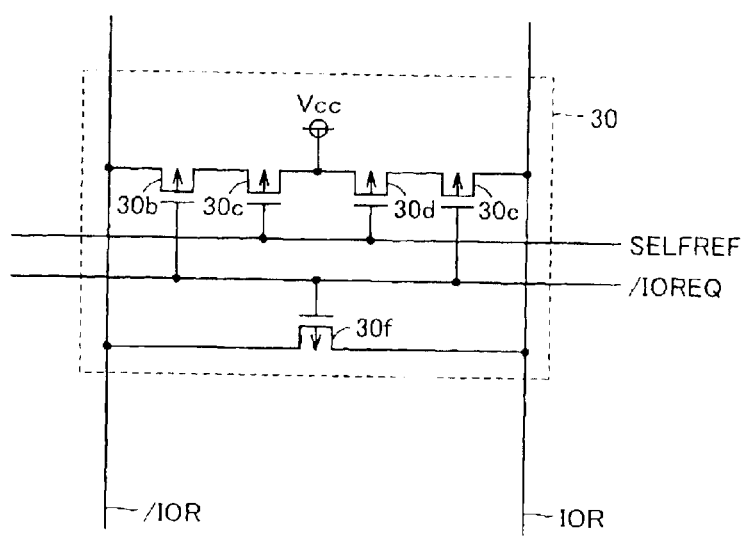
FIG. 6 is a circuit diagram showing a configuration of a read data line precharge/equalize circuit of separate IO type in the memory array according to a first modification of the first embodiment.

Referring to FIG. 6, read data line precharge/equalize circuit 30 differs from read data line precharge/equalize circuit 30 shown in FIG. 4 according to the first embodiment in that self refresh signal SELFREF is supplied to respective gates of P-channel MOS transistors 30c and 30d instead of row address strobe signal /RAS. With respect to other details, the read data line precharge/equalize circuit 30 in FIG. 6 is the same in structure and function as that of the first embodiment and thus detailed description thereof is not repeated here.

Figure 7:
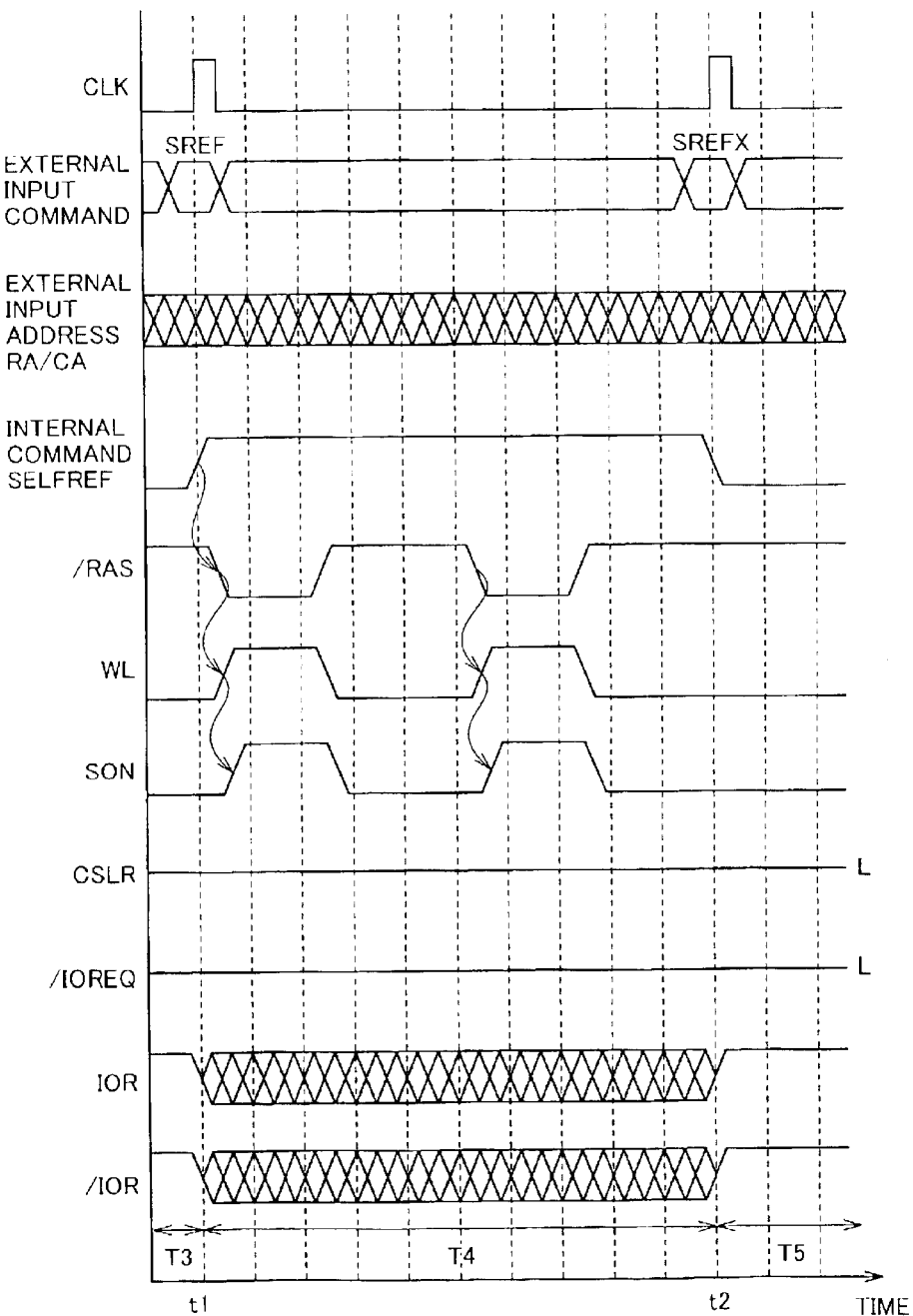
FIG. 7 is an operational waveform chart illustrating a data reading operation by a sense amplifier structure circuit and a read data line precharge/equalize circuit of separate IO type in the memory array according to the first modification of the first embodiment.

Referring to FIG. 7, external input command SREF serves to set self refresh signal SELFREF at H level, namely to start self refresh of memory array MA. External input command SREFX serves to set self refresh signal SELFREF at L level, namely to terminate self refresh of memory array MA.

At time t1, external input command SREF is supplied to logic circuit LG in system LSI 1000 to set self refresh signal SELFREF at H level. The voltage level of self refresh signal SELFREF is held in a latch circuit (not shown) in control circuit CG until external input command SREFX is supplied to logic circuit LG in system LSI 1000. After this, in period T4, self refresh is carried out by row address strobe signal /RAS, a signal on word line WL and sense amplifier activation signal SON in memory array MA. In self refresh, an internal counter (not shown) in control circuit CG increments or decrements a row address to activate all word lines WL and sense amplifiers SA. Further, self refresh is carried out, regardless of external clock, by an oscillation circuit (not shown) in control circuit CG at predetermined intervals.

In the self refresh period, data output from read data lines /IOR and IOR is unnecessary and thus a signal on read column selection line CSLR and read data line equalize signal /IOREQ are set at L level.

In periods T3 and T5 other than period T4, no self refresh is conducted and thus self refresh signal SELFREF is set at L level. Accordingly, in the period in which self refresh signal SELFREF is set at H level, i.e., in the self refresh period, read data line precharge/equalize circuit 30 operates to cancel precharging of read data lines /IOR and IOR corresponding to read column selection line CSLR.

Thus, charge on read data line /IOR is released via transistors TGc and TGe and charge on read data line IOR is released via transistors TGd and TGf in read gate RG. No movement of charges occurs on read data lines /IOR and IOR to shut off the off leakage current in transistors TGc and TGd in read gate RG.

As discussed above, memory array MA according to the first modification of the first embodiment achieves the advantage of the memory array MA of the first embodiment in an inactive period of read column selection line CSLR, particularly in the self refresh period.

Second Modification of First Embodiment

Figure 8:
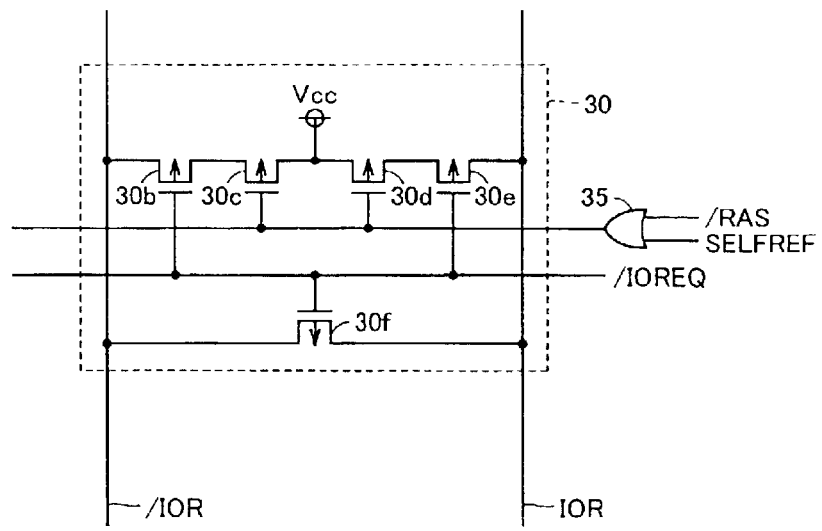
FIGS. 8–14 are circuit diagrams respectively showing respective configurations of read data line precharge/equalize circuits of separate IO type in the memory array according respectively to second to eighth modifications of the first embodiment.

Referring to FIG. 8, read data line precharge/equalize circuit 30 differs from read data line precharge/equalize circuit 30 shown in FIG. 4 in that a signal supplied to respective gates of P-channel MOS transistors 30c and 30d is not the row address strobe signal /RAS but a signal which is determined by performing logical OR between row address strobe signal /RAS and self refresh signal SELFREF by an OR circuit 35. With respect to other details, the read data line precharge/equalize circuit 30 in FIG. 8 is the same in structure and function as that shown in FIG. 4 and thus detailed description thereof is not repeated here.

According to a second modification of the first embodiment, off leakage current in transistors TGc and TGd in read gate RG is shut off at the time of non data access and at the time when row address strobe signal /RAS or self refresh signal SELFREF is at H level, namely in the standby period and self refresh period, as done by the operation of read data precharge/equalize circuit 30 of the first embodiment.

As discussed above, memory array MA according to the second modification of the first embodiment achieves the effect of memory array MA of the first embodiment, in the inactive period of read column selection line CSLR, particularly in the standby and self refresh periods.

Third Modification of First Embodiment

Figure 9:
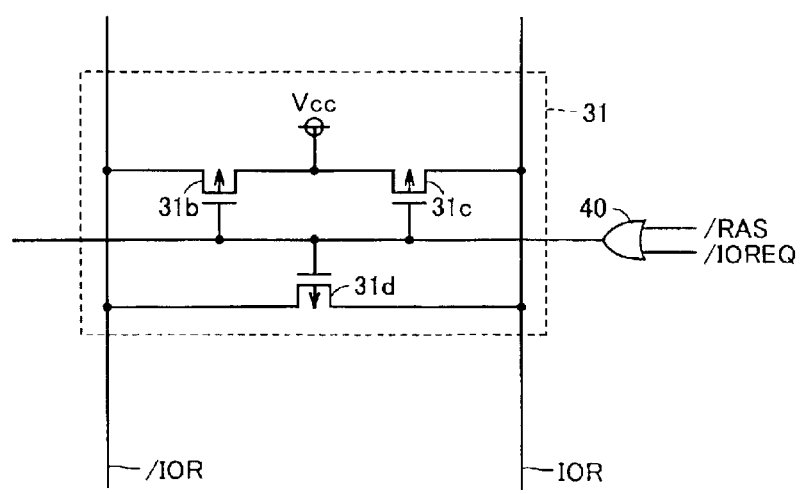

Referring to FIG. 9, a read data line precharge/equalize circuit 31 includes P-channel MOS transistors 31b and 31c connected in series between read data line /IOR and read data line IOR and a P-channel MOS transistor 31d provided between read data line /IOR and read data line IOR. To respective gates of P-channel MOS transistors 31b, 31c and 31d, a signal determined by performing logical OR between row address strobe signal /RAS and read data line equalize signal /IOREQ by an OR circuit 40 is supplied. To a connection node of P-channel MOS transistors 31b and 31c, power supply voltage Vcc is supplied.

Thus, read data line precharge/equalize circuit 31 serves to equalize and precharge read data lines /IOR and IOR in response to row address strobe signal /RAS at L level and read data line equalize signal /IOREQ at L level.

On the other hand, read data line precharge/equalize circuit 31 serves to cancel equalization and precharging of read data lines /IOR and IOR in response to row address strobe signal /RAS at H level or read data line equalize signal /IOREQ at H level.

According to a third modification of the first embodiment as described above, off leakage current in transistors TGc and TGd in read gate RG is shut off at the time of non data access and at the time when row address strobe signal /RAS has H level, namely in the inactive period of read column selection line CSLR, particularly in the self refresh period except for the period in which row address strobe signal /RAS is set at L level and in the standby period, as done by the operation of read data line precharge/equalize circuit 30 of the first embodiment.

As described above, memory array MA according to the third modification of the first embodiment has read data line precharge/equalize circuit 31 which is constituted of a smaller number of components than that of read data line precharge/equalize circuit 30 of the first embodiment, however, the third modification reduces power consumption of the memory array, i.e., semiconductor memory device. Specifically, the reduced power consumption of the semiconductor memory device is achieved in the inactive period of read column selection line CSLR, particularly in the self refresh period except for the period in which row address strobe signal /RAS is set at L level and in the standby period.

Fourth Modification of First Embodiment

Figure 10:
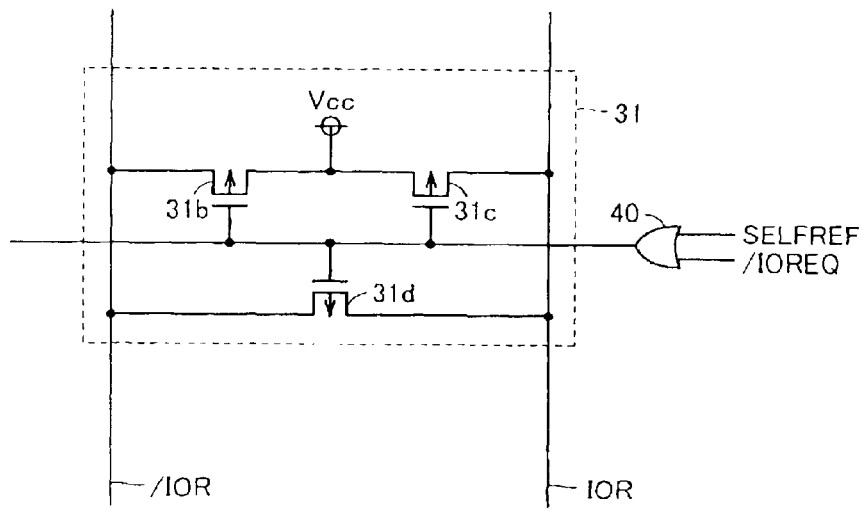

Referring to FIG. 10, read data line precharge/equalize circuit 31 according to a fourth modification of the first embodiment differs from read data line precharge/equalize circuit 31 of the third modification of the first embodiment in that the signal supplied to respective gates of P-channel MOS transistors 31b, 31c and 31d is not the signal resultant from logical OR between row address strobe signal /RAS and read data line equalize signal /IOREQ by OR circuit 40 but a signal resultant from logical OR between read data line equalize signal IOREQ and self refresh signal SELFREF by OR circuit 40. With respect to other details, the read data line precharge/equalize circuit 31 in FIG. 10 is the same in structure and function as that of the third modification of the first embodiment, and detailed description thereof is not repeated.

Thus, according to the fourth modification of the first embodiment, off leakage current in transistors TGc and TGd in read gate RG is shut off, as done by the operation of read data line precharge/equalize circuit 31 of the third modification of the first embodiment, at the time of non data access and at the time when self refresh signal SELFREF is at H level, namely in the inactive period of read column selection line CSLR, particularly in self refresh.

Memory array MA according to the fourth modification of the first embodiment achieves the effect of memory array MA of the third modification of the first embodiment, in the inactive period of read column selection line CSLR, particularly in self refresh.

Fifth Modification of First Embodiment

Figure 11:
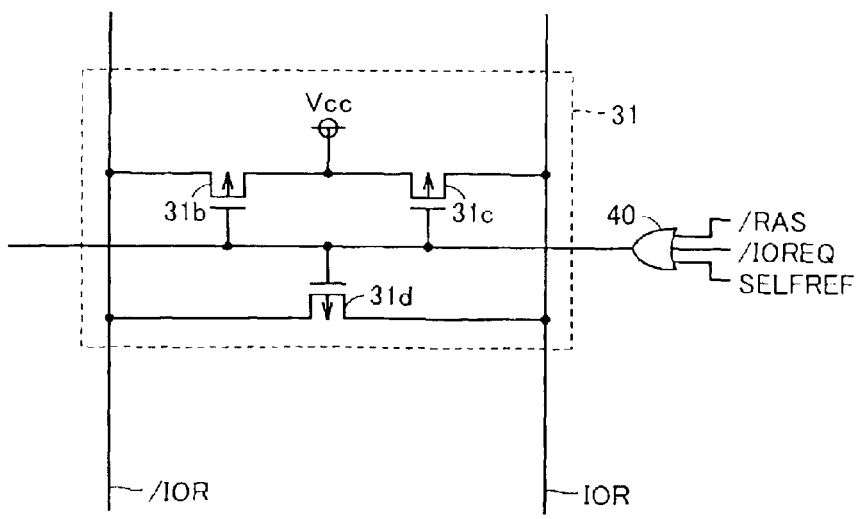

Referring to FIG. 11, read data line precharge/equalize circuit 31 according to a fifth modification of the first embodiment differs from read data line precharge/equalize circuit 31 in the third modification of the first embodiment in that a signal determined by performing logical OR between row address strobe signal /RAS, read data line equalize signal /IOREQ and self refresh signal SELFREF by OR circuit 40 is supplied to respective gates of P-channel MOS transistors 31b, 31c and 31d, instead of the signal determined by performing logical OR between row address strobe signal /RAS and read data line equalize signal /IOREQ by OR circuit 40. With respect to other details, the read data line precharge/equalize circuit 31 in the fifth modification is the same in structure and function as that in the third modification of the first embodiment and detailed description thereof is not repeated.

Thus, according to a fifth modification of the first embodiment, off leakage current in transistors TGc and TGd in read gate RG is shut off at the time of non data access and at the time when row address strobe signal /RAS or self refresh signal SELFREF has H level, namely the period in which read column selection line CSLR is inactive, particularly in the standby period and the self refresh period, as done by the operation of read data line precharge/equalize circuit 31 in the third modification of the first embodiment.

As discussed above, memory array MA according to the fifth modification of the first embodiment achieves the same effect as that of the third modification of the first embodiment in the inactive period of read column selection line CSLR, particularly in the standby and self refresh periods.

Sixth Modification of First Embodiment

Figure 12:
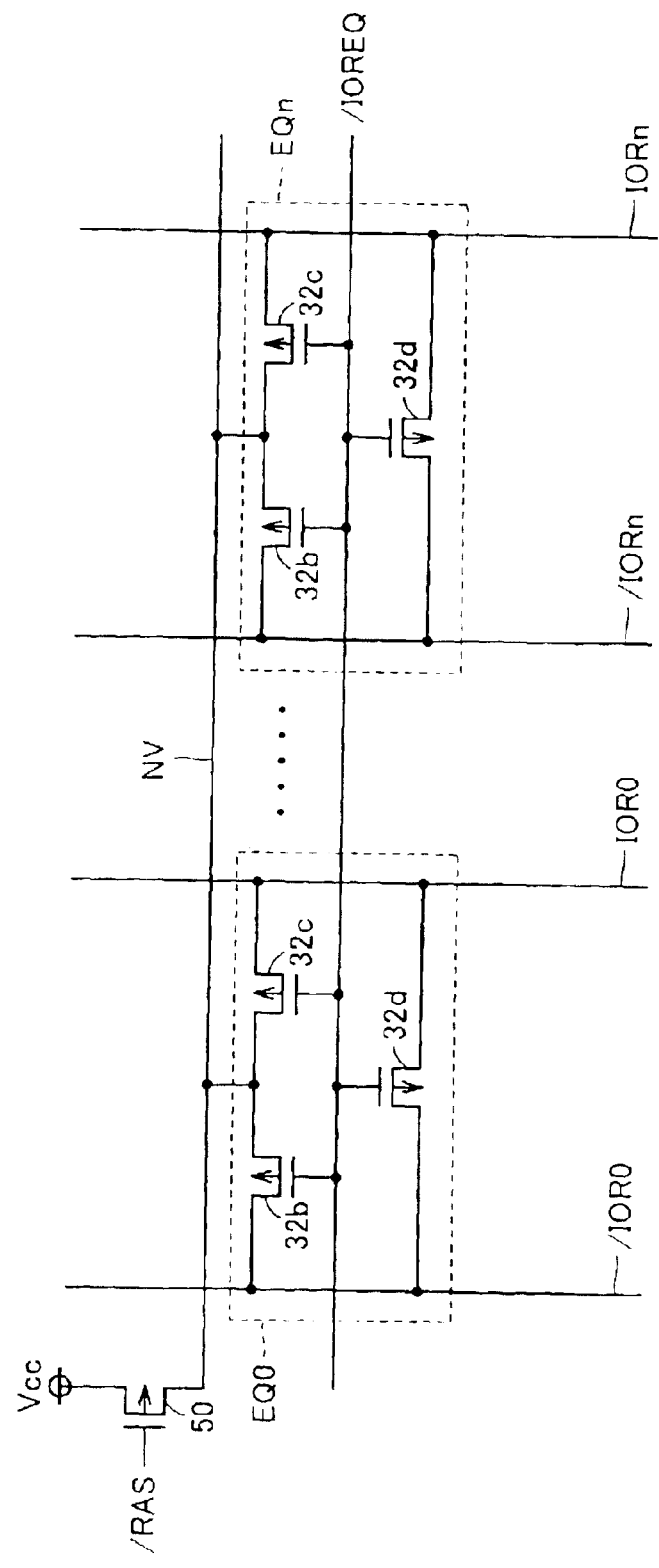

Referring to FIG. 12, a read data line precharge/equalize circuit EQ0 includes P-channel MOS transistors 32b and 32c connected in series between read data line /IOR0 and read data line IOR0, and a P-channel MOS transistor 32d provided between read data line /IOR0 and read data line IOR0. To respective gates of P-channel MOS transistors 32b, 32c and 32d, read data line equalize signal /IOREQ is supplied. To a connection node of P-channel MOS transistors 32b and 32c, power supply voltage Vcc is supplied via a P-channel MOS transistor 50 and a node NV. To the gate of P-channel MOS transistor 50, row address strobe signal /RAS is supplied. N+1 (n: natural number) circuits having the same configuration as that of read data line precharge/equalize circuit EQ0 are aligned in the row direction. In other words, to read data line precharge/equalize circuits EQ0–EQn, power supply voltage Vcc is supplied via node NV from one power supply voltage.

Read data line precharge/equalize circuits EQ0–EQn, read data lines /IOR0–/IORn and read data lines IOR0–IORn are collectively referred to respectively as read data line precharge/equalize circuit EQ and read data lines /IOR and IOR as required.

One of those n+1 read data line precharge/equalize circuits EQ, for example, read data line precharge/equalize circuit EQn is connected to read data line /IORn and read data line IORn.

Each read data line precharge/equalize circuit EQ serves to precharge corresponding read data lines /IOR and IOR in response to row address strobe signal /RAS at L level and read data line equalize signal /IOREQ at L level. Moreover, each read data line precharge/equalize circuit EQ serves to equalize corresponding read data lines /IOR and IOR in response to read data line equalize signal /IOREQ at L level.

On the other hand, each read data line precharge/equalize circuit EQ serves to cancel precharging of n+1 sets of read data lines /IOR and IOR in response to row address strobe signal /RAS at H level. Further, each read data line precharge/equalize circuit EQ serves to cancel equalization of n+1 sets of read data lines /IOR and IOR in response to read data line equalize single /IOREQ at H level.

According to a sixth modification of the first embodiment, supply of power supply voltage Vcc to each read data line precharge/equalize circuit EQ is stopped at the time of non data access and at the time when row address strobe signal /RAS has H level, namely in the self refresh period except for the period in which row address strobe signal /RAS has L level and in the standby period. Thus, in the inactive period of read column selection line CSLR, particularly in the self refresh period except for the period in which row address strobe signal /RAS has L level and in the standby period, off leakage current in transistors TGc and TGd in read gate RG corresponding to each read data line precharge/equalize circuit EQ is shut off as done by the operation of read data line precharge/equalize circuit 30 of the first embodiment.

As discussed above, to each read data line precharge/equalize circuit EQ in memory array MA according to the sixth modification of the first embodiment, power supply voltage Vcc is supplied from one power supply via P-channel MOS transistor 50. Thus, in addition to the effect of read data line precharge/equalize circuit 31 of the third modification of the first embodiment that is constantly supplied with power supply voltage Vcc, the read data line precharge/equalize circuit of this sixth modification provides an effect that the power consumption is further reduced in the period except for the period in which row address strobe signal /RAS has L level and in the standby period.

Seventh Modification of First Embodiment

Figure 13:
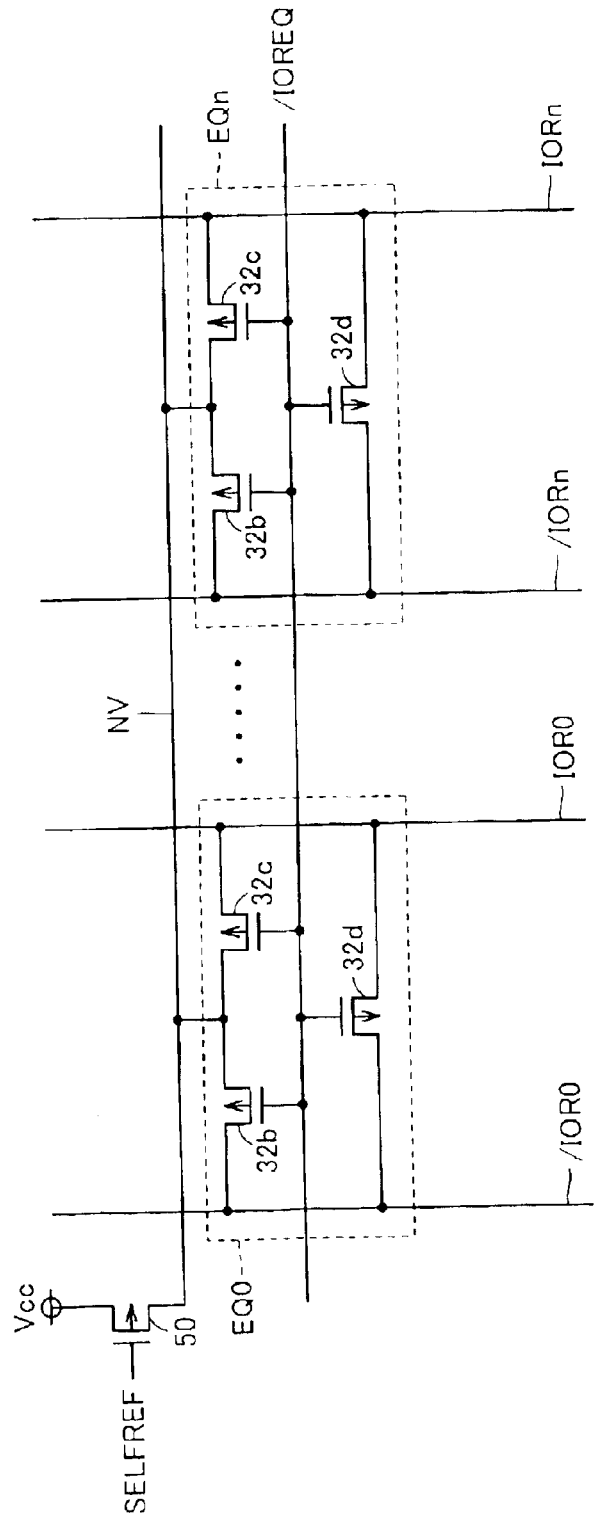

Referring to FIG. 13, each read data line precharge/equalize circuit EQ of a seventh modification of the first embodiment differs from that of the sixth modification shown in FIG. 12 in that self refresh signal SELFREF is supplied to the gate of P-channel MOS transistor 50 connected to node NV, instead of row address strobe signal /RAS. Regarding other details, the read data line precharge/equalize circuit EQ of the seventh modification is the same in structure and function as that shown in FIG. 12 and detailed description thereof is not repeated.

According to the seventh modification of the first embodiment, supply of power supply voltage Vcc to each read data line precharge/equalize circuit EQ is stopped at the time of non data access and when self refresh signal SELFREF has H level, namely, in the self refresh period. Thus, in the inactive period of read column selection line CSLR, particularly in the self refresh period, off leakage current in transistors TGc and TGd in read gate RG corresponding to read data line precharge/equalize circuit EQ each is shut off as done by the operation of read data line precharge/equalize circuit EQ in the sixth modification of the first embodiment.

As discussed above, in the self refresh period, memory array MA according to the seventh modification of the first embodiment achieves the effect of memory array MA in the sixth modification of the first embodiment.

Eighth Modification of First Embodiment

Figure 14:
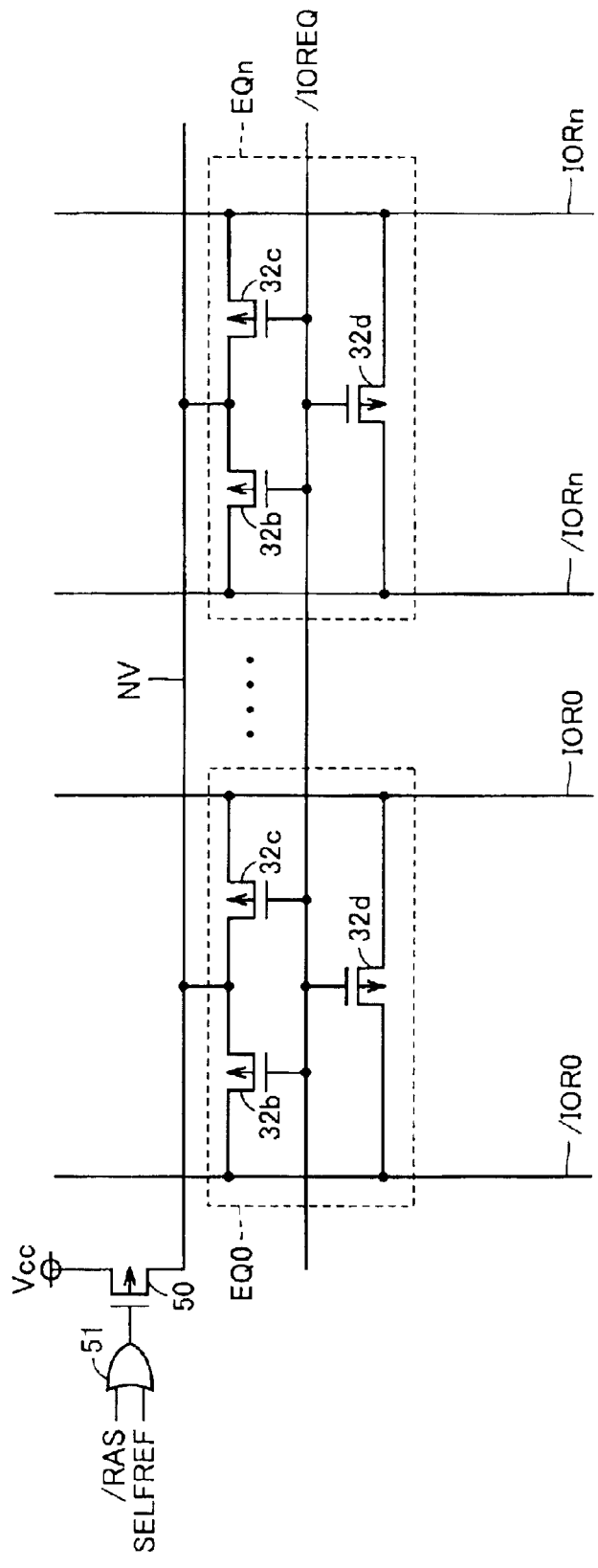

Referring to FIG. 14, each read data line precharge/equalize circuit EQ according to an eighth modification of the first embodiment differs from each read data line precharge/equalize circuit EQ in the sixth modification shown in FIG. 12 in that a signal determined by performing logical OR between row address strobe signal /RAS and self refresh signal SELFREF by an OR circuit 51 is supplied to the gate of P-channel MOS transistor 50 connected to node NV, instead of row address strobe signal /RAS. Regarding other details, read data line precharge/equalize circuit EQ of the eighth modification is the same in structure and function as that of the sixth modification and detailed description thereof is not repeated.

According to the eighth modification of the first embodiment, supply of power supply voltage Vcc to each read data line precharge/equalize circuit EQ is stopped at the time of non data access and at the time when row address strobe signal /RAS or self refresh signal SELFREF has H level, namely in the period except for the period in which row address strobe signal /RAS has L level and in the standby and self refresh periods. Thus, in the inactive period of read column selection line CSLR, particularly in the standby and self refresh periods, the off leakage current in transistors TGc and TGd in read gate RG corresponding to each read data line precharge/equalize circuit EQ is shut off as done by the operation of read data line precharge/equalize circuit EQ in the sixth modification of the first embodiment.

As discussed above, in the standby period and self refresh period, memory array MA in the eighth modification of the first embodiment achieves the effect of memory array MA in the sixth modification of the first embodiment.

Second Embodiment

Figure 15:
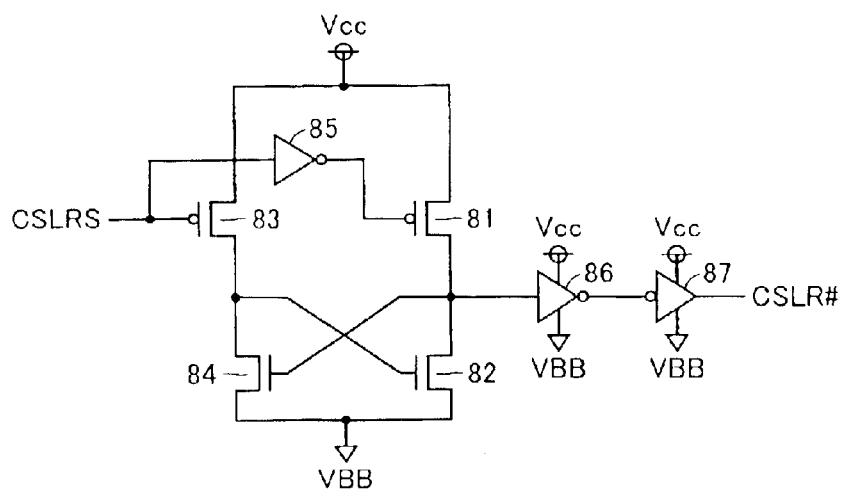
FIG. 15 is a circuit diagram showing a configuration of a voltage conversion circuit in a row/column decoder shown in FIG. 1 according to a second embodiment.

Referring to FIG. 15, a signal level conversion circuit 80 includes a P-channel MOS transistor 83 and an N-channel MOS transistor 84 connected in series between a power supply voltage Vcc and a negative voltage VBB, a P-channel MOS transistor 81 and an N-channel MOS transistor 82 connected in series between power supply voltage Vcc and negative voltage VBB, and an inverter 85.

To the gate of P-channel MOS transistor 83, a read column selection signal CSLRS for selecting a desired read column selection line CSLR is supplied. To the gate of P-channel MOS transistor 81, a signal having its level resultant from inversion of the level of read column selection signal CSLRS by inverter 85 is supplied. A connection node between P-channel MOS transistor 83 and N-channel MOS transistor 84 is connected to the gate of N-channel MOS transistor 82. A connection node between P-channel MOS transistor 81 and N-channel MOS transistor 82 is connected to the gate of N-channel MOS transistor 84.

Signal level conversion circuit 80 further includes inverters 86 and 87. Inverter 86 provides, as Vcc, a signal with H level on the connection node between P-channel MOS transistor 81 and N-channel MOS transistor 82, and provides, as negative voltage VBB, the signal thereon with L level. Inverter 87 provides the output signal from inverter 86 with H level as Vcc and with L level as negative voltage VBB, the output from inverter 87 being a read column selection signal CSLR#.

In other words, signal level conversion circuit 80 converts read column selection signal CSLRS into read column selection signal CSLR# and provides the resultant signal therefrom. Thus, the H and L levels of read column selection signal CSLR# are set as Vcc and negative voltage VBB respectively.

Read column selection signal CSLR# having L level resultant from conversion by signal level conversion circuit 80 is supplied to read column selection line CSLR of sense amplifier structure circuit 110 in FIG. 3 and thus negative voltage VBB is supplied to respective gates of N-channel MOS transistors TGc and TGd in read gate RG. Then, off leakage current in N-channel MOS transistors TGc and TGd is shut off. As sense amplifier structure circuit 110 is integrated in memory array MA, the power consumption of memory array MA is reduced. It is noted that the effect as described above is achieved when read column selection signal CSLR# of L level is supplied to read column selection line CSLR in a sense amplifier structure circuit of separate IO type described below.

As discussed above, read column selection signal CSLR# of negative voltage VBB is supplied to read column selection line CSLR in memory array MA of separate IO type according to the second embodiment to reduce power consumption of the semiconductor memory device.

Third Embodiment

Figure 16:
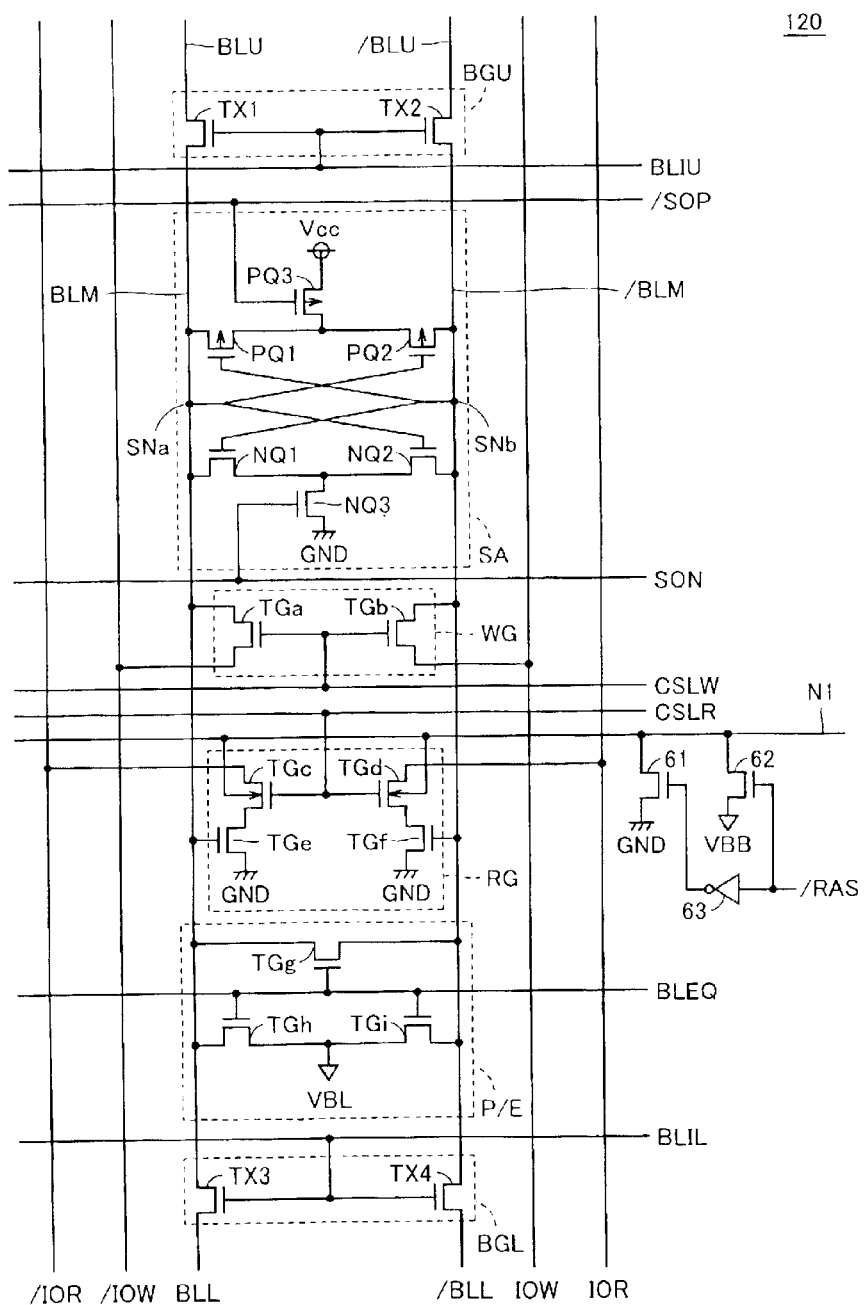
FIG. 16 is a circuit diagram showing a configuration of a sense amplifier structure circuit of separate IO type in the sense amplifier band shown in FIG. 2 according to a third embodiment.

Referring to FIG. 16, a sense amplifier structure circuit 120 according to a third embodiment differs from sense amplifier structure circuit 110 in FIG. 3 of the first embodiment in that the former circuit further includes N-channel MOS transistors 61 and 62 and an inverter 63.

Sense amplifier structure circuit 120 further differs from sense amplifier structure circuit 110 in that the back gates of N-channel MOS transistors TGc and TGd in read gate RG are connected to node N1, that N-channel MOS transistor 61 is provided between node N1 and ground voltage GND, and that N-channel MOS transistor 62 is provided between node N1 and negative voltage VBB.

Moreover, sense amplifier structure circuit 120 differs from sense amplifier structure circuit 110 in that row address strobe signal /RAS is supplied to the gate of N-channel MOS transistor 62 and that the signal having its level resultant from inversion of the level of row address strobe signal /RAS by inverter 63 is supplied to the gate of N-channel MOS transistor 61. With respect to other details, sense amplifier structure circuit 120 shown in FIG. 16 is the same as sense amplifier structure circuit 110 in FIG. 3 and detailed description thereof is not repeated. The voltage of L level of row address strobe signal /RAS supplied to the gate of N-channel MOS transistor 62 is set at negative voltage VBB by a voltage level conversion circuit (not shown).

Thus, sense amplifier structure circuit 120 sets the voltage on the back gates of N-channel MOS transistors TGc and TGd at ground voltage GND in the period in which row address strobe signal /RAS is set at L level. On the other hand, in the period in which row address strobe signal /RAS is set at H level, i.e., in the self refresh period except for the period in which row address strobe signal /RAS is set at L level and in the standby period, sense amplifier structure circuit 120 sets the voltage on the back gates of N-channel MOS transistors TGc and TGd at negative voltage VBB. As the voltage on the back gates of N-channel MOS transistors TGc and TGd is set at negative voltage VBB, the threshold voltage of N-channel MOS transistors TGc and TGd increases so that off leakage current in N-channel MOS transistors TGc and TGd is shut off. Accordingly, since sense amplifier structure circuit 120 is integrated in memory array MA of separate IO type, the power consumption of memory array MA is reduced. The circuit constituted of N-channel MOS transistors 61 and 62 and inverter 63 serves as a current shutoff circuit to shut off the off leakage current in N-channel MOS transistors TGc and TGd in response to control signals.

As discussed above, in the self refresh period except for the period in which row address strobe signal /RAS is set at L level and in the standby period, the voltage on the back gates of N-channel MOS transistors TGc and TGd is set at negative voltage VBB in memory array MA of separate IO type in the third embodiment, and thus the power consumption of the semiconductor memory device is reduced.

First Modification of Third Embodiment

Figure 17:
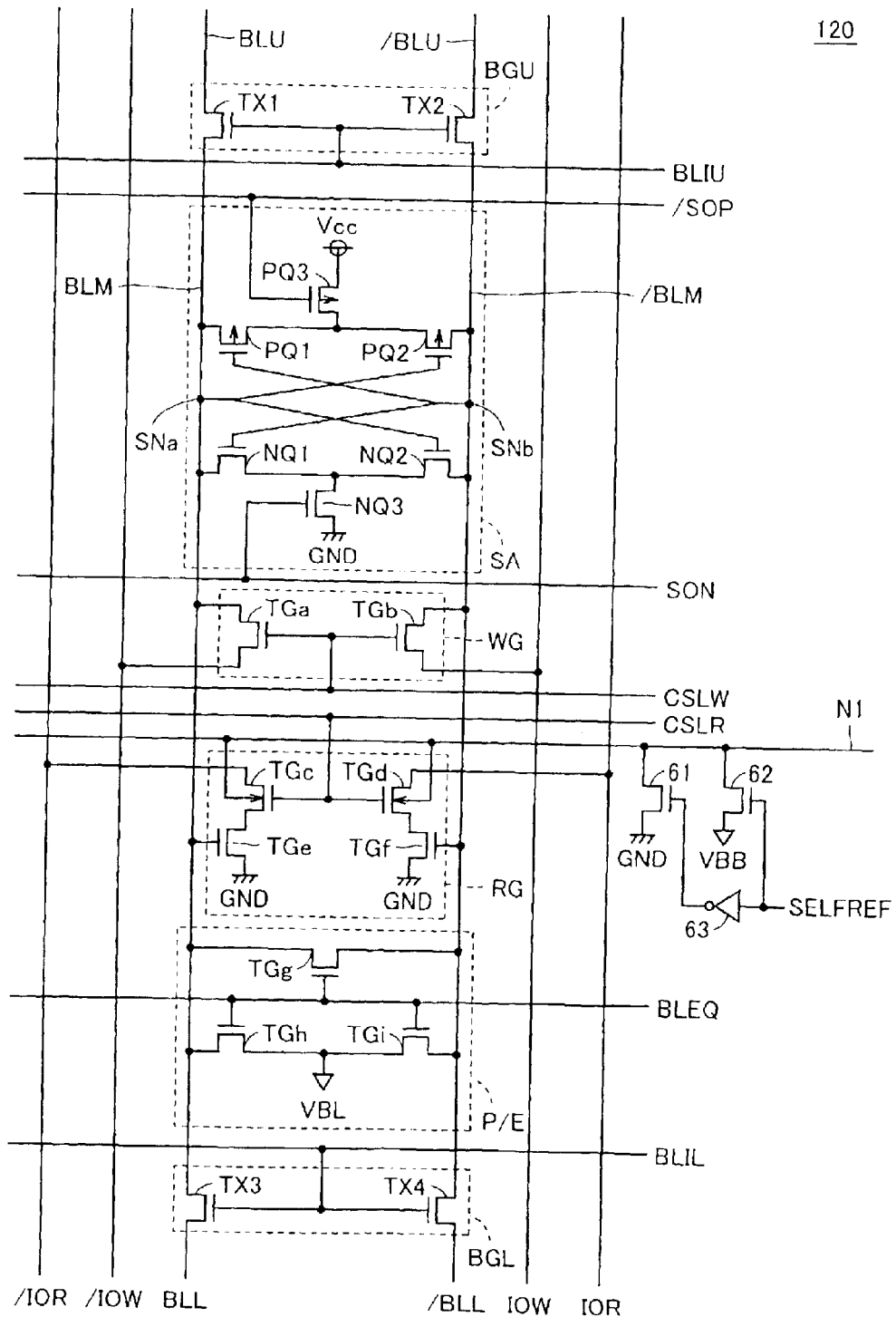
FIGS. 17 and 18 are circuit diagrams showing respective configurations of sense amplifier structure circuits of separate IO type in the sense amplifier band shown in FIG. 2 according respectively to first and second modifications of the third embodiment.

Referring to FIG. 17, a sense amplifier structure circuit 120 according to a first modification of the third embodiment differs from sense amplifier structure circuit 120 of the third embodiment in that self refresh signal SELFREF is supplied to inverter 63 and the gate of N-channel MOS transistor 62 instead of row address strobe signal /RAS. With respect to other details, sense amplifier structure circuit 120 of the first modification is the same in structure and function as sense amplifier structure circuit 120 of the third embodiment shown in FIG. 16, and detailed description thereof is not repeated. The voltage of L level of self refresh signal SELFREF which is supplied to the gate of N-channel MOS transistor 62 is set at negative voltage VBB by a voltage level conversion circuit (not shown).

According to the first modification of the third embodiment, when self refresh signal SELFREF has H level, i.e., in self refresh, the voltage on the back gates of N-channel MOS transistors TGc and TGd is set at negative voltage VBB. Off leakage current in N-channel MOS transistors TGc and TGd is thus shut off. As sense amplifier structure circuit 120 is integrated in memory array MA of separate IO type, the power consumption of memory array MA is reduced.

As discussed above, the effect of memory array MA of the third embodiment is thus achieved in self refresh in memory array MA of separate IO type according to the first modification of the third embodiment.

Second Modification of Third Embodiment

Figure 18:
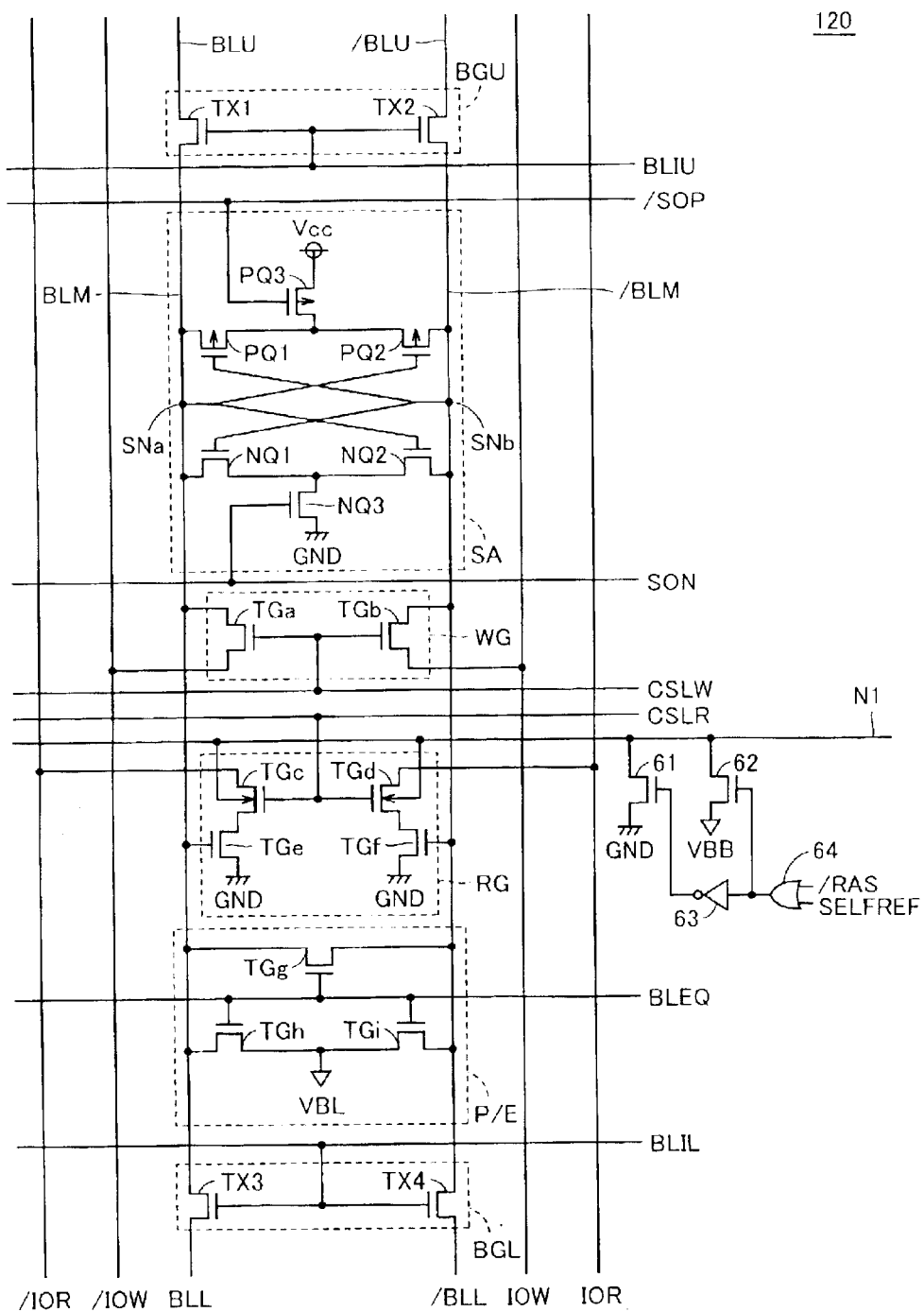

Referring to FIG. 18, a sense amplifier structure circuit 120 according to a second modification of the third embodiment differs from sense amplifier structure circuit 120 of the third embodiment in that a signal which is determined by performing logical OR between row address strobe signal /RAS and self refresh signal SELFREF by an OR circuit 64 is supplied to inverter 63 and the gate of N-channel MOS transistor 62, instead of row address strobe signal /RAS. With respect to other details, sense amplifier structure circuit 120 of the second modification is the same in structure and function as sense amplifier structure circuit 120 of the third embodiment shown in FIG. 16, and detailed description thereof is not repeated. The voltage of L level of row address strobe signal /RAS and self refresh signal SELFREF provided to OR circuit 64 is set at negative voltage VBB by a voltage level conversion circuit (not shown). The voltage of L level of the output signal from OR circuit 64 is thus set at negative voltage VBB.

According to the second modification of the third embodiment, at the time of non data access and at the time when row address strobe signal /RAS or self refresh signal SELREF has H level, i.e., in the standby and self refresh periods, the voltage on the back gates of N-channel MOS transistors TGc and TGd is set at negative voltage VBB. Accordingly, the off leakage current in N-channel MOS transistors TGc and TGd is shut off. As sense amplifier structure circuit 120 is integrated in memory array MA of separate IO type, the power consumption of memory array MA is reduced.

As discussed above, memory array MA of separate IO type according to the second modification of the third embodiment also achieves, at the time of standby and self refresh, the effect that is achieved by memory array MA of the third embodiment.

Fourth Embodiment

Figure 19:
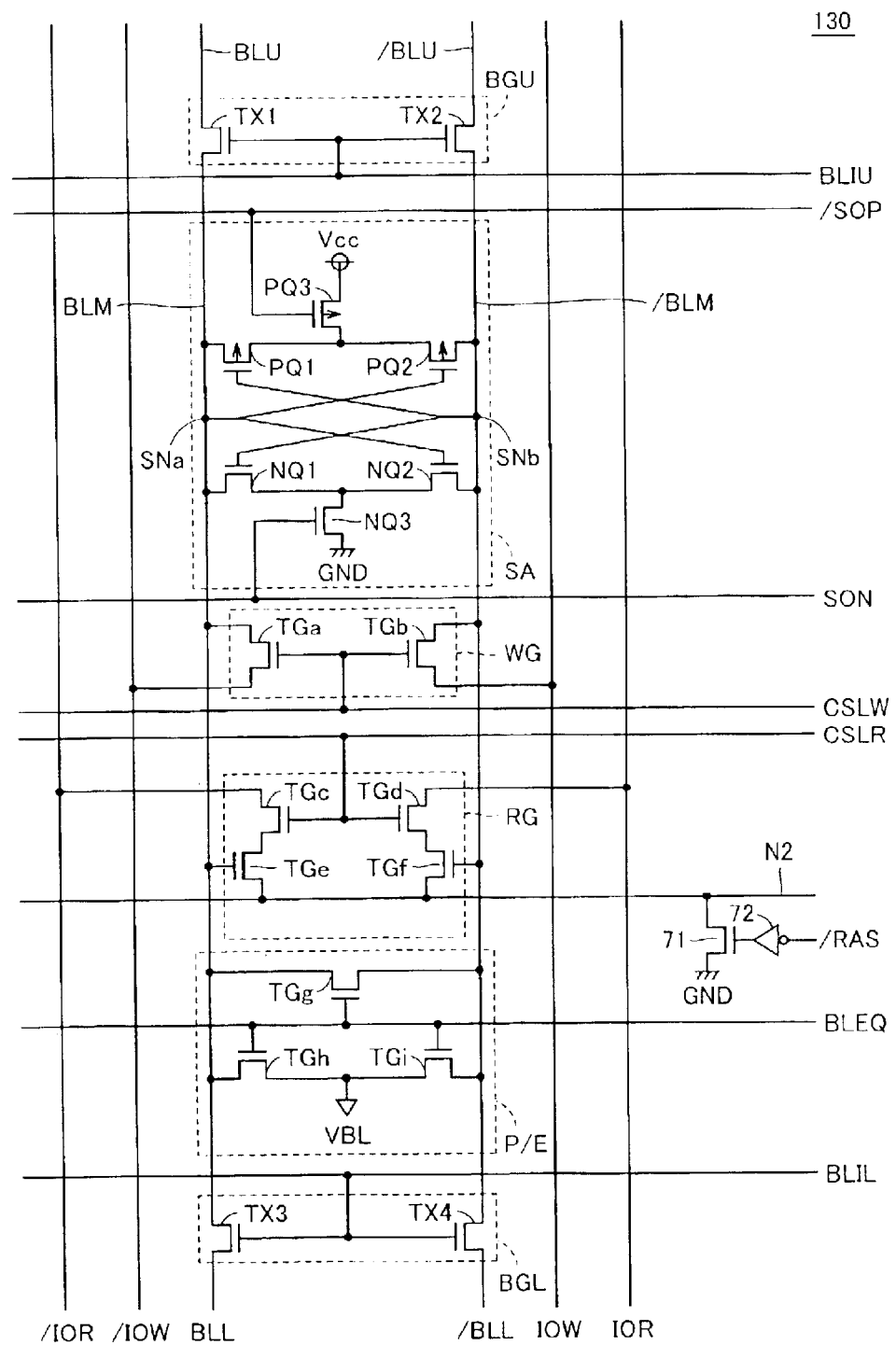
FIG. 19 is a circuit diagram showing a configuration of a sense amplifier structure circuit of separate IO type in the sense amplifier band shown in FIG. 2 according to a fourth embodiment.

Referring to FIG. 19, a sense amplifier structure circuit 130 of a fourth embodiment differs from sense amplifier structure circuit 110 of the first embodiment shown in FIG. 3 in that the former circuit additionally includes an N-channel MOS transistor 71 and an inverter 72.

Moreover, sense amplifier structure circuit 130 of the fourth embodiment differs from sense amplifier structure circuit 110 in that respective sources of N-channel MOS transistors TGe and TGf in read gate RG are connected to node N2 instead of ground voltage GND and that N-channel MOS transistor 71 is provided between node N2 and ground voltage GND.

In addition, sense amplifier structure circuit 130 of the fourth embodiment differs from sense amplifier structure circuit 110 in that row address strobe signal /RAS converted by inverter 72 into a signal of the inverted level is supplied to the gate of N-channel MOS transistor 71.

Sense amplifier structure circuit 130 of the fourth embodiment thus sets the voltage on respective sources of N-channel MOS transistors TGe and TGf at ground voltage GND at the time of non data access and in the period in which row address strobe signal /RAS is set at L level. On the other hand, sense amplifier structure circuit 130 causes respective sources of N-channel MOS transistors TGe and TGf to be in a floating state in the period in which row address strobe signal /RAS is set at H level, i.e., in the self refresh period except for the period in which row address strobe signal /RAS is set at L level and in the standby period. Off leakage current in N-channel MOS transistors TGc and TGd is thus shut off. As sense amplifier structure circuit 130 is integrated in memory array MA, the power consumption of memory array MA is reduced.

Although this embodiment refers to one sense amplifier structure circuit, node N2 is actually connected to respective sources of transistors TGe and TGf in read gate RG corresponding to each of a plurality of read data lines /IOR and IOR.

As discussed above, in memory array MA of separate IO type according to the fourth embodiment, respective sources of N-channel MOS transistors TGe and TGf are in the floating state to reduce the power consumption of the semiconductor memory device in the self refresh period except for the period in which row address strobe signal /RAS is set at L level and in the standby period.

First Modification of Fourth Embodiment

Figure 20:
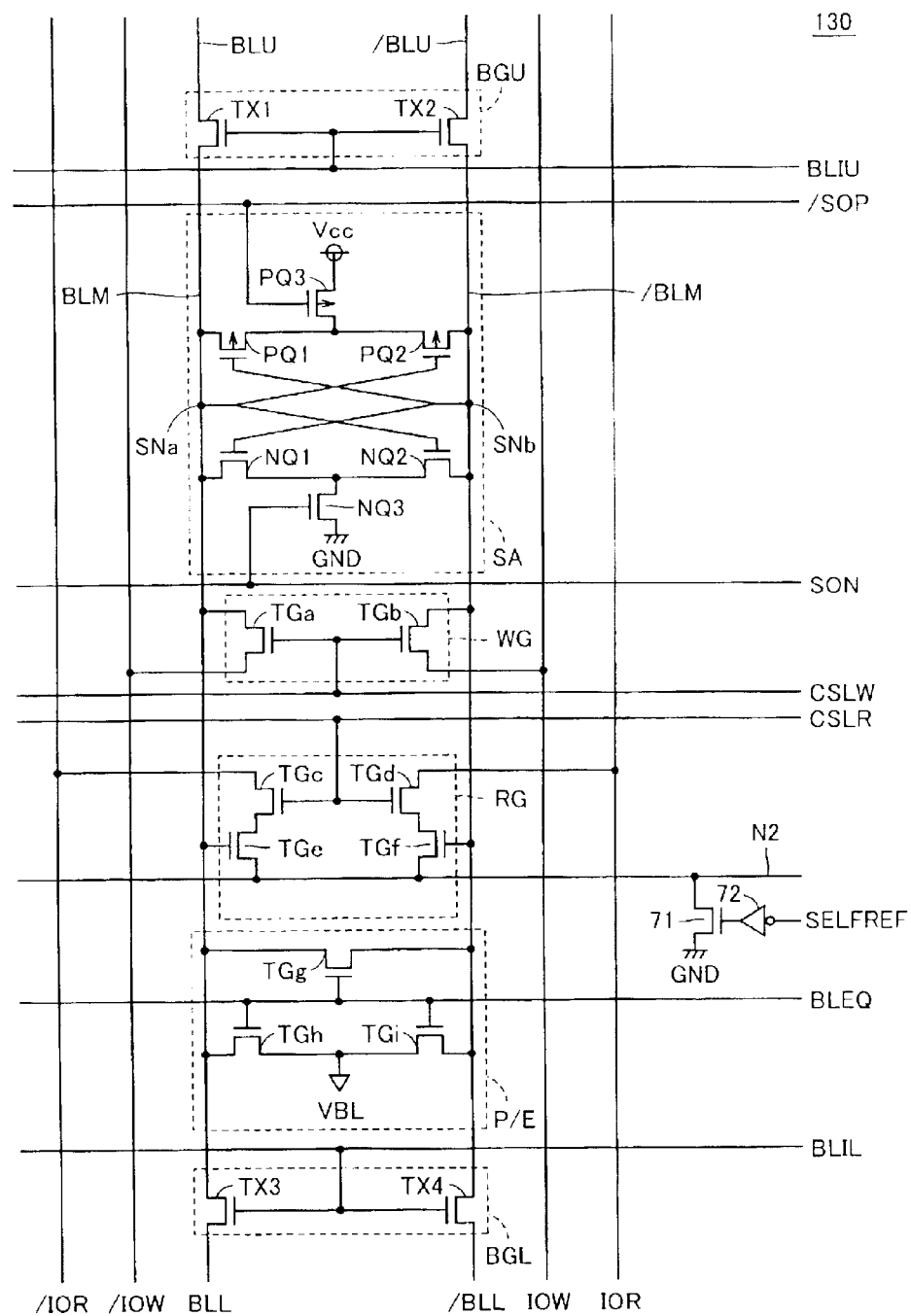
FIGS. 20 and 21 are circuit diagrams showing respective configurations of sense amplifier structure circuits of separate IO type in the sense amplifier band shown in FIG. 2 according respectively to first and second modifications of the fourth embodiment.

Referring to FIG. 20, a sense amplifier structure circuit 130 according to a first modification of the fourth embodiment differs from that of the fourth embodiment in that self refresh signal SELFREF is input to inverter 72 instead of row address strobe signal /RAS. With respect to other details, sense amplifier structure circuit 30 of the first modification is the same in structure and function as that of the fourth embodiment shown in FIG. 19 and detailed description thereof is not repeated.

According to the first modification of the fourth embodiment, respective sources of N-channel MOS transistors TGe and TGf are in a floating state when self refresh signal SELFREF has H level in non data access, i.e., in self refresh. Off leakage current in N-channel MOS transistors TGc and TGd is thus shut off. As sense amplifier structure circuit 130 is integrated in memory array MA, the power consumption of memory array MA is reduced.

As discussed above, memory array MA of separate IO type according to the first modification of the fourth embodiment also achieves, at the time of self refresh, the effect of memory array MA of the fourth embodiment.

Second Modification of Fourth Embodiment

Figure 21:
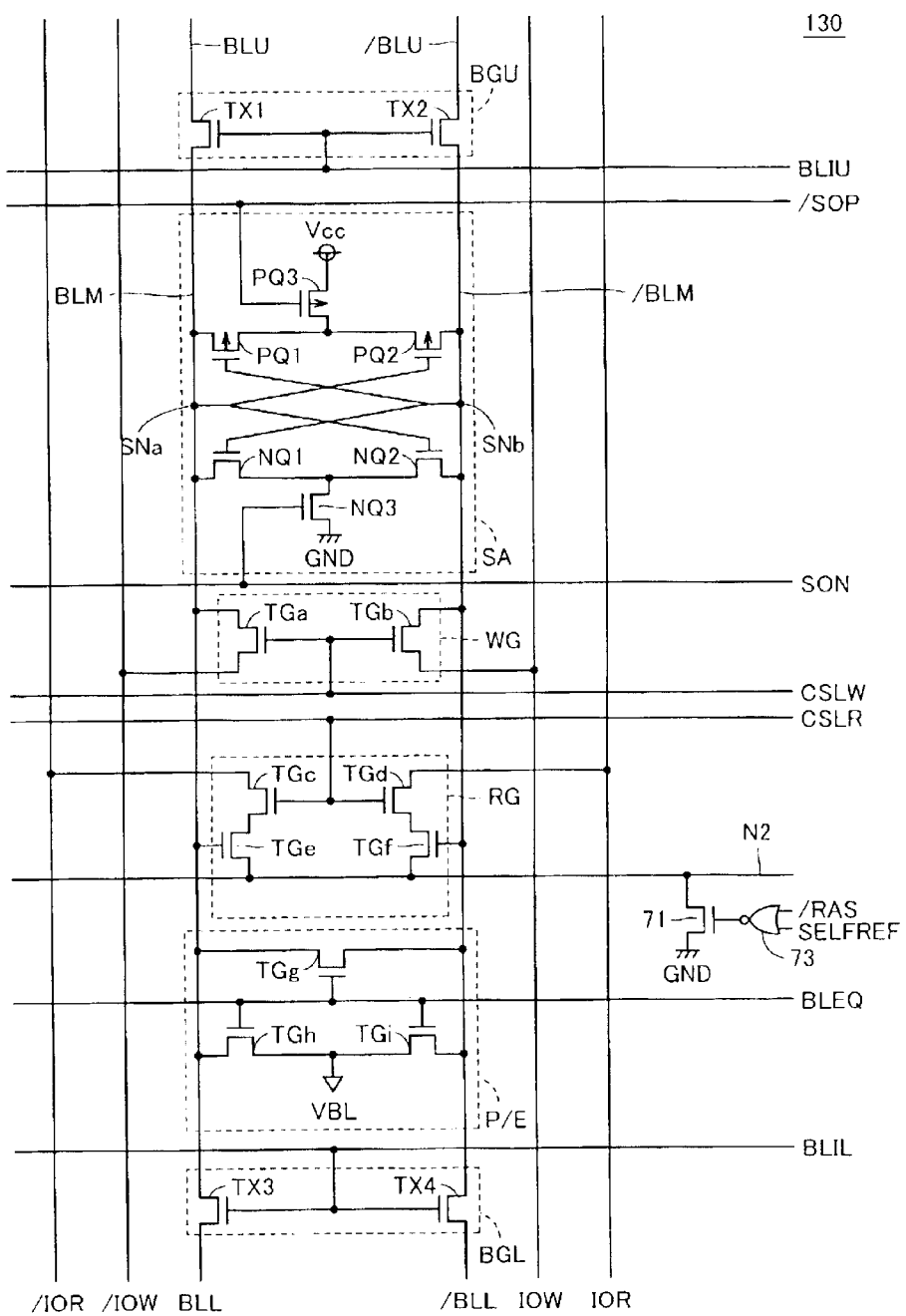

Referring to FIG. 21, a sense amplifier structure circuit 130 according to a second modification of the fourth embodiment differs from that of the fourth embodiment in that a signal determined by performing logical OR operation between row address strobe signal /RAS and self refresh signal SELFREF by an OR circuit 73 is supplied to the gate of N-channel MOS transistor 71 instead of row address strobe signal /RAS supplied thereto via inverter 72. With respect to other details, sense amplifier structure circuit 130 of the second modification is the same in structure and function as that of the fourth embodiment shown in FIG. 19 and detailed description thereof is not repeated.

Respective sources of N-channel MOS transistors TGe and TGf are thus in a floating state at the time of non data access and at the time when row address strobe signal /RAS or self refresh signal SELFREF has H level, i.e., in the standby and self refresh periods. Off leakage current in N-channel MOS transistors TGc and TGd is thus shut off. As sense amplifier structure circuit 130 is integrated in memory array MA, the power consumption of memory array MA is reduced.

As discussed above, memory array MA of separate IO type according to the second modification of the fourth embodiment also achieves, in the standby and self refresh periods, the effect of memory array MA of the fourth embodiment.

Fifth Embodiment

The description above refers to memory array MA of separate IO type having separately provided read data lines /IOR and IOR for reading data from a selected memory cell as well as write data lines /IOW and IOW for writing data into a selected memory cell. The present invention, however, is applicable to a memory array of common IO type having data lines combining the functions of reading data from a selected memory cell and of writing data into a selected memory cell.

Figure 22:
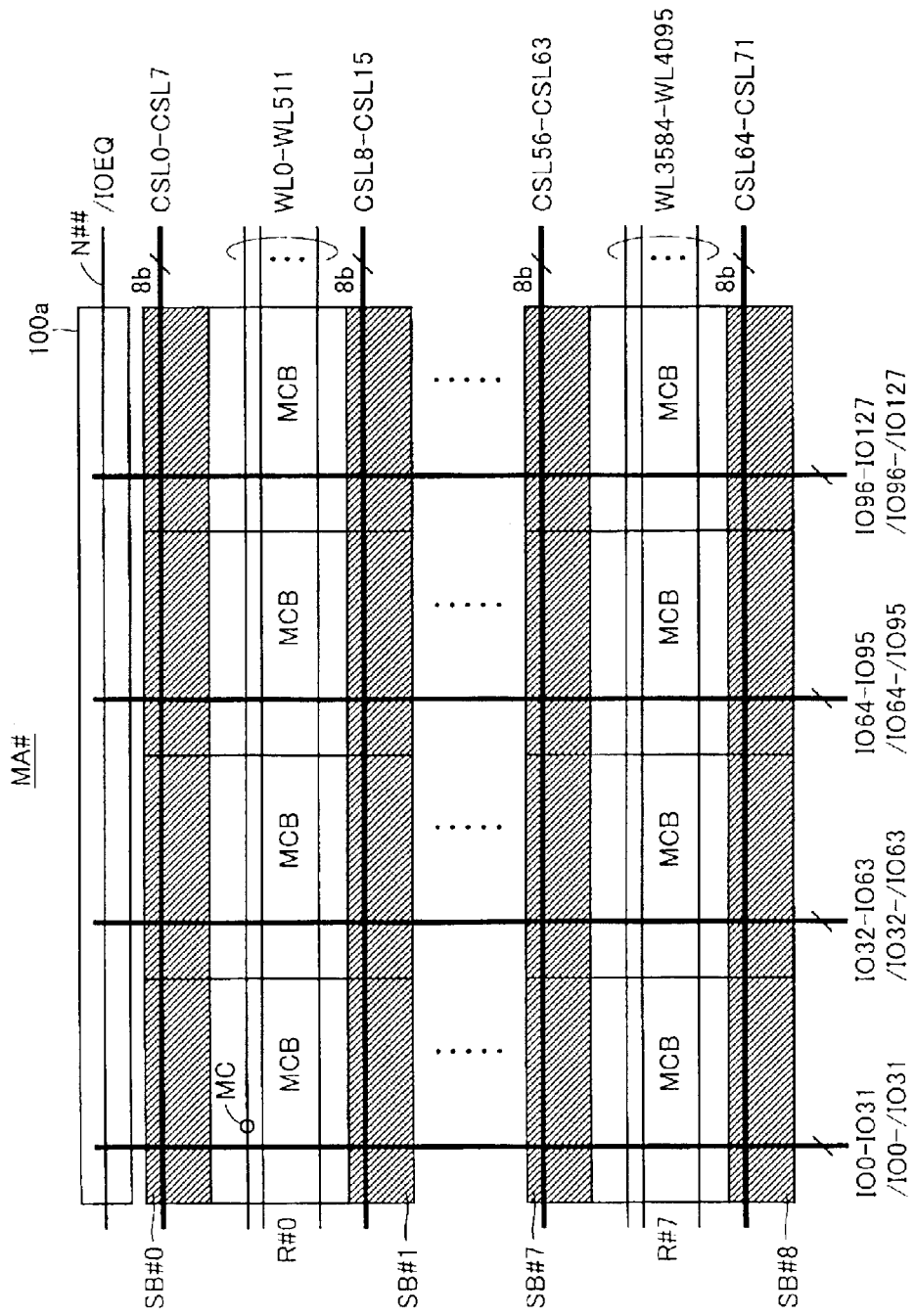
FIG. 22 schematically shows a configuration of a memory array of common IO type according to a fifth embodiment.

Referring to FIG. 22, a memory array MA# is integrated in memory arrays MA0 and MA1 shown in FIG. 1.

Memory array MA# differs from memory array MA shown in FIG. 2 in that the former memory array MA# does not include write column selection lines CSLW0–CSLW71, write data lines IOW0–IOW127 and write data lines /IOW0–/IOW127.

Memory array MA# further differs from memory array MA in that the former memory array MA# includes column selection lines CSL0–CSL71 instead of read column selection lines CSLR0–CSLR71, that it includes data lines IO0–IO127 and data lines /IO0–/IO127 instead of read data lines IOR0–IOR127 and read data lines /IO0–/IO127, and that it includes a group of equalize circuits 100a instead of the group of equalize circuits 100.

In addition, memory array MA# differs from memory array MA in that data line equalize signal /IOEQ is transmitted by a node N## instead of read data line equalize signal /IOREQ transmitted by node N#. With respect to other details, memory array MA# is the same in structure as memory array MA shown in FIG. 2 and detailed description thereof is not repeated.

In the following description, column selection lines CSL0–CSL71 may collectively referred to as column selection line CSL.

Figure 23:
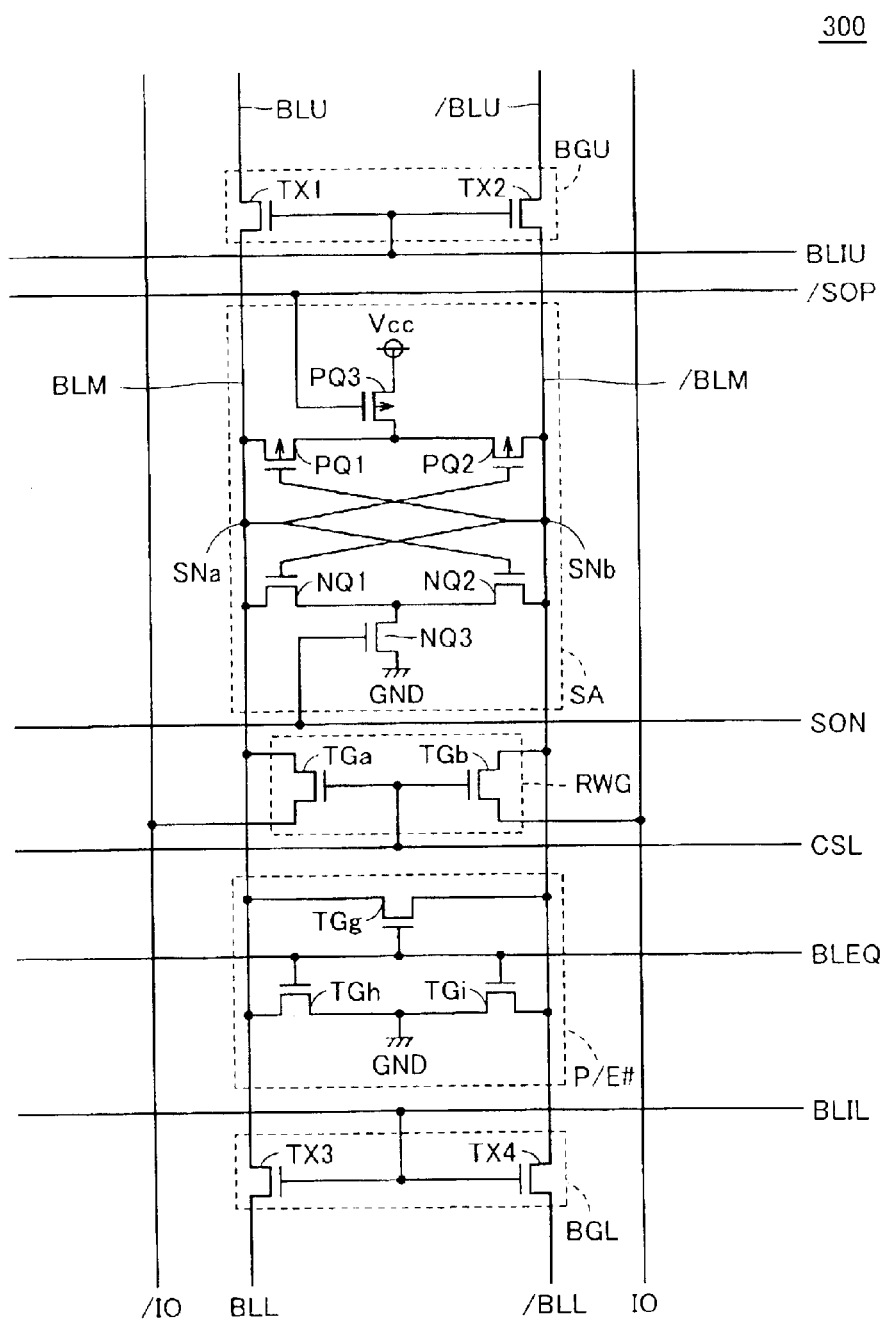
FIG. 23 is a circuit diagram showing a configuration of a sense amplifier structure circuit of common IO type in a sense amplifier band shown in FIG. 22 according to the fifth embodiment.

Referring to FIG. 23, a sense amplifier structure circuit 300 differs from sense amplifier structure circuit 110 of the first embodiment shown in FIG. 3 in that the former circuit does not include read gate RG, read column selection line CSLR and read data lines /IOR and IOR.

Further, sense amplifier structure circuit 300 differs from sense amplifier structure circuit 110 in that the former circuit includes a read/write circuit RWG instead of write gate WG, precharge/equalize circuit P/E# instead of precharge/equalize circuit P/E, data lines /IO and IO instead of write data lines /IOW and IOW and a column selection line CSL instead of write column selection line CSLW. With respect to other structural details, sense amplifier structure circuit 300 is the same as sense amplifier structure circuit 110 in FIG. 3 and detailed description thereof is not repeated.

Read/write circuit RWG differs from write gate WG in that respective drains of transfer gates TGa and TGb are connected respectively to data lines /IO and IO instead of write data lines /IOW and IOW. With respect to other structural details, read/write circuit RWG is the same as write gate WG and detailed description thereof is not repeated. Thus, read/write circuit RWG serves to electrically connect bit lines BLM and /BLM respectively to data lines /IO and IO in response to a signal on column selection line CSL.

Precharge/equalize circuit P/E# differs from precharge equalize circuit P/E in that the voltage on a connection node between N-channel MOS transistors TGh and TGi is set at ground voltage GND instead of intermediate voltage VBL. Regarding other structural details, precharge/equalize circuit P/E# is the same as precharge/equalize circuit P/E and detailed description thereof is not repeated. Precharge/equalize circuit P/E# thus serves to precharge and equalize bit lines BLM and /BLM to ground voltage GND in response to bit line equalize signal BLEQ.

In sense amplifier structure circuit 300 according to the fifth embodiment, bit lines BLM and /BLM are usually precharged to ground voltage GND and data lines /IO and IO are precharged to power supply voltage Vcc in the standby and self refresh periods in which no data is read from a selected memory cell. Then, even if the signal on column selection line CSL has L level, the voltage levels respectively of drains and sources of N-channel MOS transistors TGa and TGb are set at power supply voltage Vcc and ground voltage GND. Consequently, off leakage current flows between the drains and sources of N-channel MOS transistors TGa and TGb.

A data line precharge/equalize circuit for avoiding the above-described off leakage current in the transistors is now described below.

Figure 24:
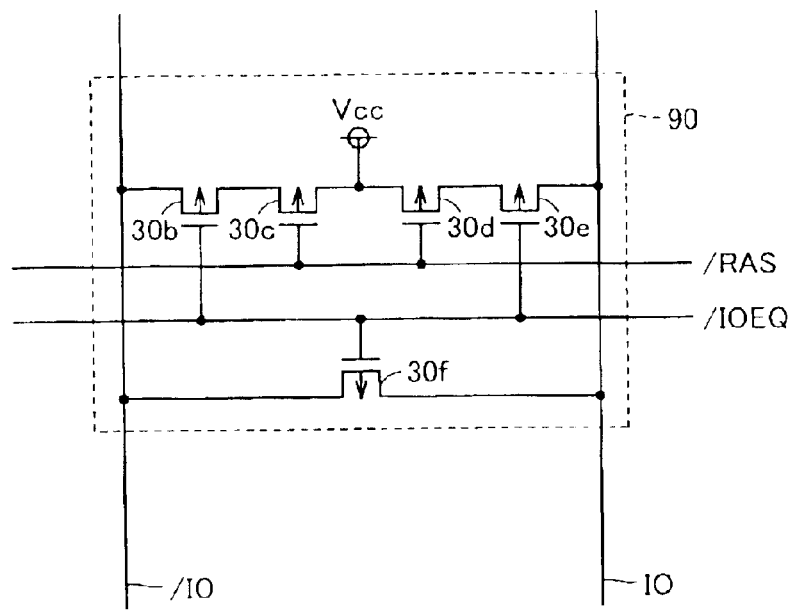
FIG. 24 is a circuit diagram showing a configuration of a data line precharge/equalize circuit of common IO type in a memory array according to the fifth embodiment.

Referring to FIG. 24, data line precharge/equalize circuit 90 according to the fifth embodiment differs from read data line precharge/equalize circuit 30 of the first embodiment shown in FIG. 4 in that data lines /IO and IO are precharged and equalized instead of read data lines /IOR and IOR.

Further, data line precharge/equalize circuit 90 differs from read data line precharge/equalize circuit 30 of the first embodiment in that data line equalize signal /IOEQ is supplied to the gates of P-channel MOS transistors 30b and 30e instead of read data line equalize signal /IOREQ. With respect to other structural and functional details, data line precharge/equalize circuit 90 is the same as read data line precharge/equalize circuit 30 and detailed description thereof is not repeated.

According to the fifth embodiment, the precharging of data lines /IO and IO is cancelled as done by the operation of read data line precharge/equalize circuit 30 of the first embodiment, at the time of non data access and at the time when row address strobe signal /RAS has H level, namely in the inactive period of column selection line CSL, in particular in the self refresh period except for the period in which row address strobe signal /RAS is set at L level and in the standby period.

Charges on data lines /IO and IO thus move from respective drains of transistors TGa and TGb in read/write circuit RWG to respective sources thereof. Accordingly, there is no potential difference between data line /IO and bit line BLM and between data line IO and bit line /BLM and thus no charge moves on data lines /IO and IO. Then, off leakage current in transistors TGa and TGb is shut off.

As discussed above, memory array MA# of common IO type according to the fifth embodiment also achieves the effect of memory array MA of separate IO type of the first embodiment in the inactive period of column selection line CSL, particularly in the self refresh period except for the period in which row address strobe signal /RAS is set at L level and in the standby period.

First Modification of Fifth Embodiment

Figure 25:
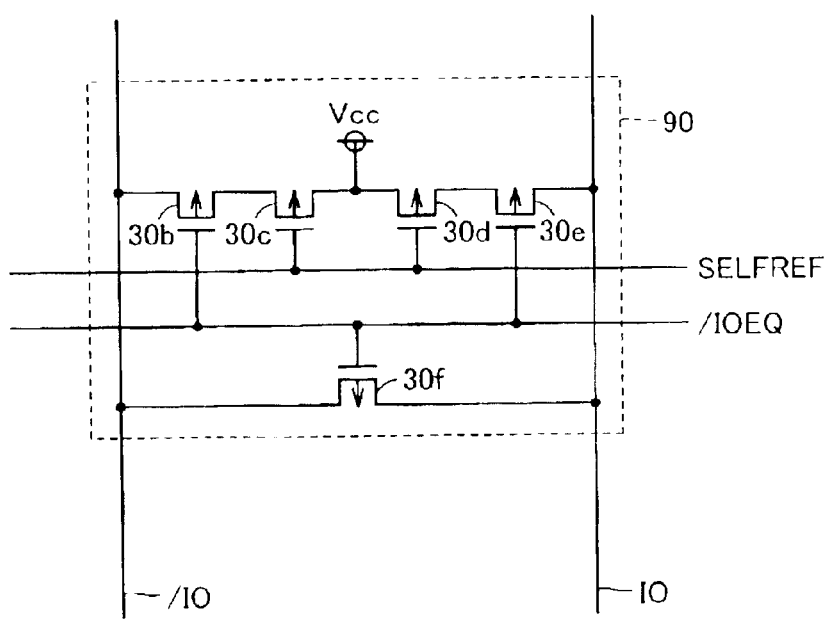
FIGS. 25–32 are circuit diagrams respectively showing respective configurations of data line precharge/equalize circuits of common IO type in the memory array according respectively to first to eighth modifications of the fifth embodiment.

Referring to FIG. 25, a data line precharge/equalize circuit 90 according to a first modification of the fifth embodiment differs from that of the fifth embodiment shown in FIG. 24 in that self refresh signal SELFREF is supplied to the gates of P-channel MOS transistors 30c and 30d instead of row address strobe signal /RAS. Regarding other structural and functional details, data line precharge/equalize circuit 90 here is the same as that of the fifth embodiment and detailed description thereof is not repeated.

According to the first modification of the fifth embodiment, off leakage current in transistors TGa and TGb in read/write circuit RWG is shut off at the time of non data access and at the time when self refresh signal SELFREF has H level, namely in the inactive period of column selection line CSL, particularly in the self refresh period.

As discussed above, memory array MA# of common IO type according to the first modification of the fifth embodiment also achieves the effect of memory array MA# of the fifth embodiment in the inactive period of column selection line CSL, particularly in the self refresh period.

Second Modification of Fifth Embodiment

Figure 26:
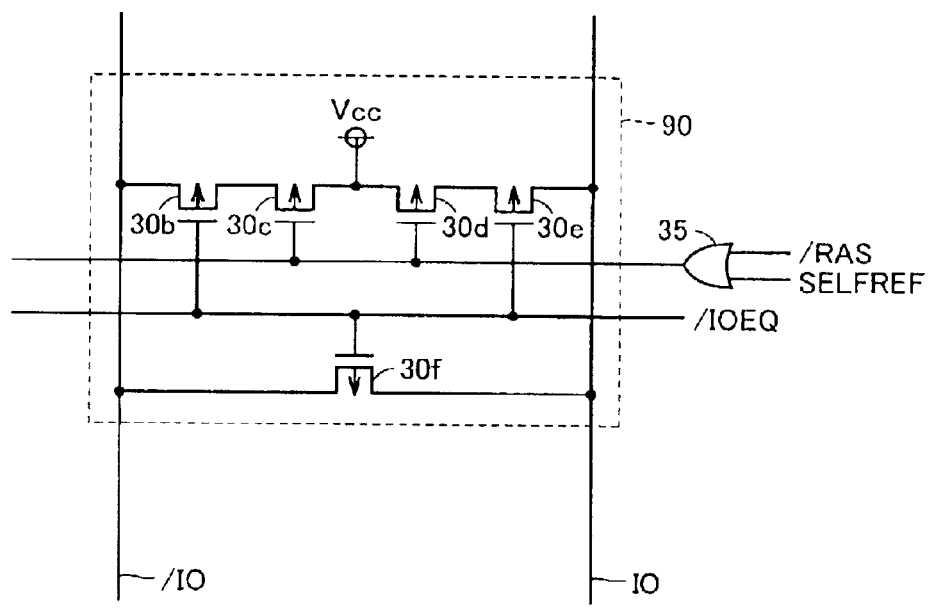

Referring to FIG. 26, a data line precharge/equalize circuit 90 according to a second modification of the fifth embodiment differs from that of the fifth embodiment shown in FIG. 24 in that a signal determined by performing logical OR operation between row address strobe signal /RAS and self refresh signal SELFREF by an OR circuit 35 is supplied to the gates of P-channel MOS transistors 30c and 30d instead of row address strobe signal /RAS. Regarding other structural and functional details, data line precharge/equalize circuit 90 according to the second modification of the fifth embodiment is the same as data line precharge/equalize circuit 90 of the fifth embodiment and detailed description thereof is not repeated.

Thus, according to the first modification of the fifth embodiment, off leakage current in transistors TGa and TGb of read/writ circuit RWG is shut off at the time of non data access and at the time when row address strobe signal /RAS and self refresh signal SELFREF have H level, namely in the inactive period of column selection line CSL, particularly in the standby and self refresh periods.

As discussed above, memory array MA# of common IO type according to the first modification of the fifth embodiment also achieves the effect of memory array MA# of the fifth embodiment, in the inactive period of column selection line CSL, particularly in the standby and self refresh periods.

Third Modification of Fifth Embodiment

Figure 27:
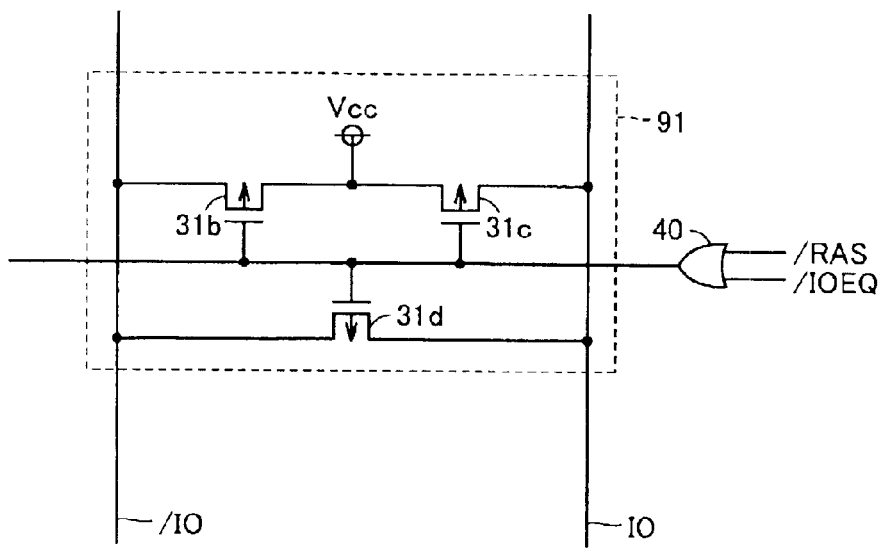

Referring to FIG. 27, a data line precharge/equalize circuit 91 according to a third modification of the fifth embodiment differs from read data line precharge/equalize circuit 31 according to the third modification of the first embodiment that is shown in FIG. 9 in that data lines /IO and IO are precharged and equalized instead of read data lines /IOR and IOR.

Further, data line precharge/equalize circuit 91 differs from read data line precharge/equalize circuit 31 of the third modification of the first embodiment in that a signal determined by performing logical OR operation between row address strobe signal /RAS and data line equalize signal /IOEQ by OR circuit 40 is supplied to the gates of P-channel MOS transistors 31b, 31c and 31d, instead of the signal determined by performing logical OR operation between row address strobe signal /RAS and read data line equalize signal /IOREQ by OR circuit 40. Regarding other structural and functional details, data line precharge/equalize circuit 91 is the same as read data line precharge/equalize circuit 31 and detailed description thereof is not repeated.

According to the third modification of the fifth embodiment, off leakage current in transistors TGa and TGb in read/write circuit RWG is shut off, as done by the operation of read data line precharge/equalize circuit 31 of the third modification of the first embodiment, at the time of non data access and at the time when row address strobe signal /RAS has H level, namely in the inactive period of column selection line CSL, particularly in the self refresh period except for the period in which row address strobe signal /RAS is set at L level and in the standby period.

As discussed above, memory array MA# of common IO type according to the third modification of the fifth embodiment also achieves the effect of memory array MA of separate IO type of the third modification of the first embodiment, in the inactive period of column selection line CSL, particularly in the self refresh period except for the period in which row address strobe signal /RAS is set at L level and in the standby period.

Fourth Modification of Fifth Embodiment

Figure 28:
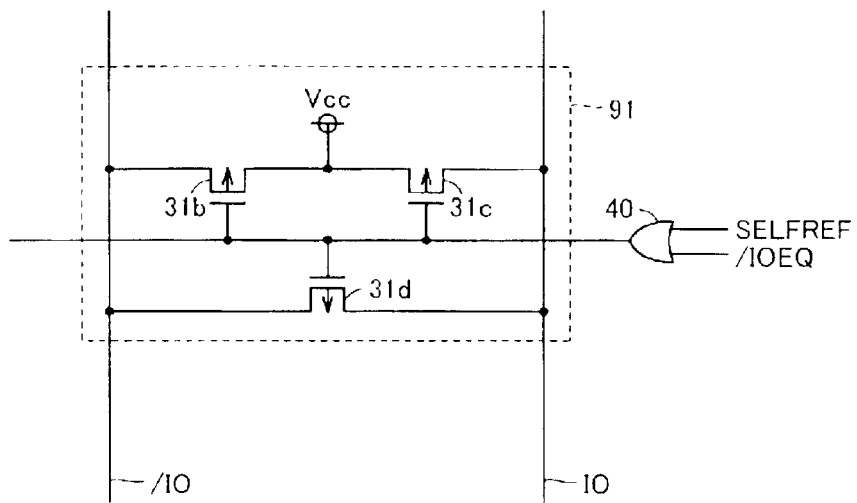

Referring to FIG. 28, a data line precharge/equalize circuit 91 according to a fourth modification of the fifth embodiment differs from that of the third modification of the fifth embodiment in that a signal determined by performing logical OR between self refresh signal SELFREF and data line equalize signal /IOEQ by an OR circuit 40 is supplied to the gates of P-channel MOS transistors 31b, 31c and 31d instead of the signal determined by performing logical OR between row address strobe signal /RAS and data line equalize signal /IOEQ by OR circuit 40. With respect to other structural and functional details, data line precharge/equalize circuit 91 of this fourth modification is the same as that of the third modification of the fifth embodiment and detailed description thereof is not repeated.

According to the fourth modification of the fifth embodiment, off leakage current in transistors TGa and TGb in read/write circuit RWG is shut off at the time of non data access and at the time when self refresh signal SELFREF has H level, namely in the inactive period of column selection line CSL, particularly in the self refresh period.

As discussed above, memory array MA# of common IO type according to the fourth modification of the fifth embodiment also achieves the effect of memory array MA# of the third modification of the fifth embodiment in the inactive period of column selection line CSL, particularly in the self refresh period.

Fifth Modification of Fifth Embodiment

Figure 29:
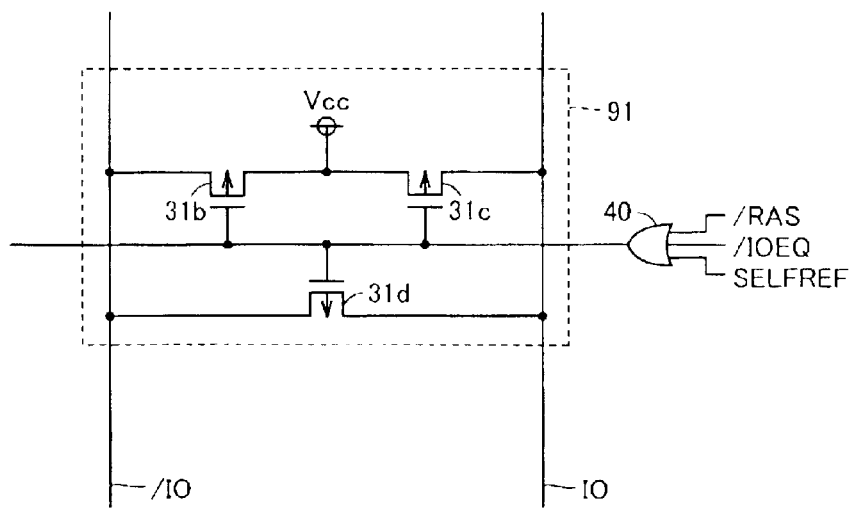

Referring to FIG. 29, a data line precharge/equalize circuit 91 according to a fifth modification of the fifth embodiment differs from that of the third modification of the fifth embodiment shown in FIG. 27 in that a signal determined by performing logical OR between row address strobe signal /RAS, data line equalize signal /IOEQ and self refresh signal SELFREF by an OR circuit 40 is supplied to the gates of P-channel MOS transistors 31b, 31c and 31d instead of the signal determined by performing logical OR between row address strobe signal /RAS and data line equalize signal /IOEQ by OR circuit 40. With respect to other structural and functional details, data line precharge/equalize circuit 91 of this fifth modification is the same as that of the third modification of the fifth embodiment and detailed description thereof is not repeated.

According to the fifth modification of the fifth embodiment, off leakage current in transistors TGa and TGb in read/write circuit RWG is shut off at the time of non data access and at the time when row address strobe signal /RAS and self refresh signal SELFREF have H level, namely in the inactive period of column selection line CSL, particularly in the standby period and self refresh period.

As discussed above, memory array MA# of common IO type according to the fifth modification of the fifth embodiment also achieves the effect of memory array MA# of the third modification of the fifth embodiment in the inactive period of column selection line CSL, particularly in the standby period and self refresh period.

Sixth Modification of Fifth Embodiment

Figure 30:
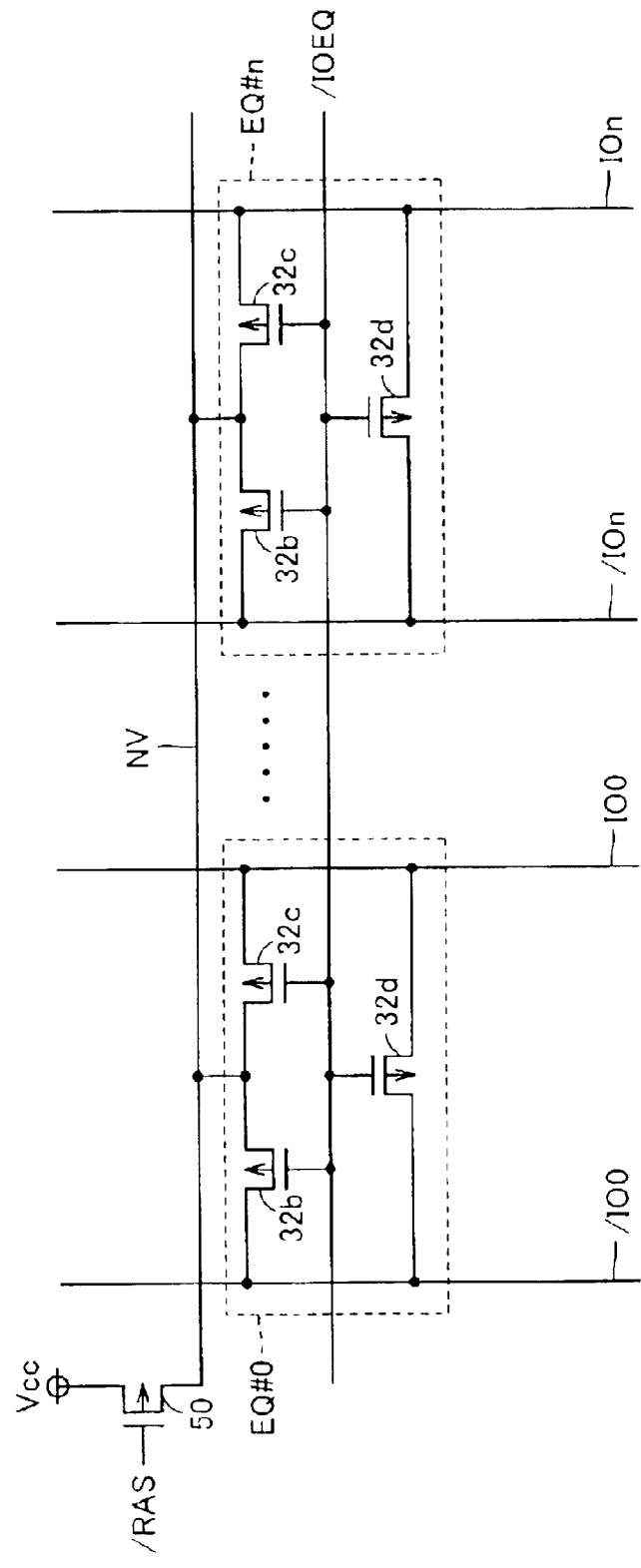

Referring to FIG. 30, data line precharge/equalize circuits EQ#0–EQ#n according to a sixth modification of the fifth embodiment differ from data line precharge/equalize circuit EQ according to the sixth modification of the first embodiment shown in FIG. 12 in that data line precharge/equalize circuits EQ#0–EQ#n respectively precharge/equalize data lines /IO0–IOn and data lines IO0–IOn instead of read data lines /IOR0–/IORn and read data lines IOR0–IORn.

Further, data line precharge/equalize circuits EQ#0–EQ#n differ from read data line precharge/equalize circuit EQ0–EQn of the sixth modification of the first embodiment in that data line equalize signal /IOEQ is supplied to the gates of P-channel MOS transistors 32b, 32c and 32d of data line precharge/equalize circuits EQ#0–EQ#n each instead of read data line equalize signal /IOREQ. With respect to other structural and functional details, data line precharge/equalize circuits EQ#0–EQ#n are the same as read data line precharge/equalize circuits EQ0–EQn of the sixth modification of the first embodiment and detailed description thereof is not repeated.

In the following description, data line precharge/equalize circuits EQ#0–EQ#n, data lines /IO0–/IOn and data lines IO0–IOn may collectively be referred to as data line precharge/equalize circuit EQ#, data line /IO and data line IO respectively.

According to the sixth modification of the fifth embodiment, supply of the power supply voltage Vcc to each data line precharge/equalize circuit EQ# is stopped at the time of non data access and at the time when row address strobe signal /RAS has H level, namely in the self refresh period except for the period in which row address strobe signal /RAS is set at L level and in the standby period. In the inactive period of column selection line CSL, particularly in the self refresh period except for the period in which row address strobe signal /RAS is set at L level and in the standby period, off leakage current in transistors TGa and TGb in read/write circuit RWG corresponding to each data line precharge/equalize circuit EQ# is shut off, as done by the operation of read data line precharge/equalize circuit EQ of the sixth modification of the first embodiment.

As discussed above, memory array MA# of common IO type according to the sixth modification of the fifth embodiment also achieves the effect of memory array MA of separate IO type of the sixth modification of the first embodiment in the self refresh period except for the period in which row address strobe signal /RAS is set at L level and in the standby period.

Seventh Modification of Fifth Embodiment

Figure 31:
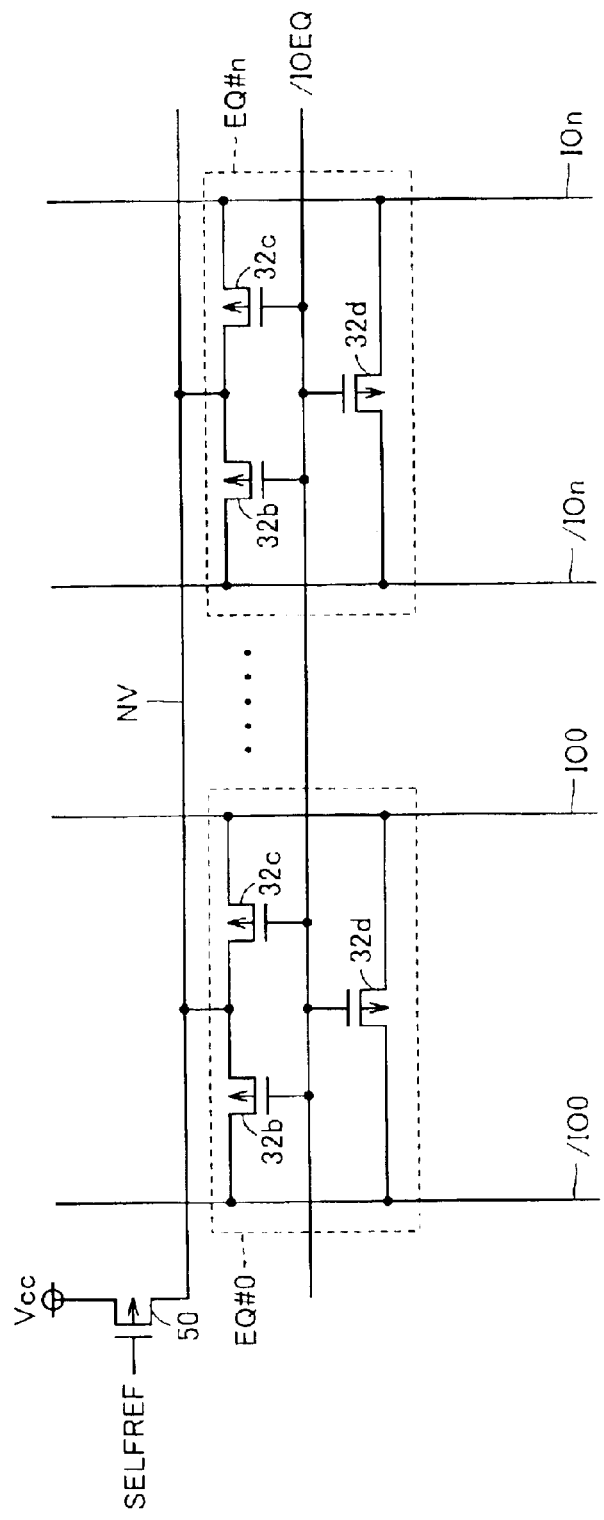

Referring to FIG. 31, each data line precharge/equalize circuit EQ# according to a seventh modification of the fifth embodiment differs from each data line precharge/equalize circuit EQ# of the sixth modification of the fifth embodiment shown in FIG. 30 in that self refresh signal SELFREF is supplied to the gate of P-channel MOS transistor 50 instead of row address strobe signal /RAS. Regarding other structural and functional details, data line precharge/equalize circuit EQ# of this seventh modification is the same as that of the sixth modification of the fifth embodiment and detailed description thereof is not repeated.

According to the seventh modification of the fifth embodiment, supply of the power supply voltage Vcc to each data line precharge/equalize circuit EQ# is thus stopped at the time of non data access and at the time when self refresh signal SELFREF has H level, namely in the self refresh period. Accordingly, off leakage current in transistors TGa and TGb in read/write circuit RWG corresponding to each data line precharge/equalize circuit EQ# is shut off, as done by the operation of read data line precharge/equalize circuit EQ of the sixth modification of the first embodiment, in the inactive period of column selection line CSL, particularly in the self refresh period.

As discussed above, memory array MA# of common IO type according to the seventh modification of the fifth embodiment also achieves the effect of memory array MA# of the sixth modification of the fifth embodiment in the self refresh period.

Eighth Modification of Fifth Embodiment

Figure 32:
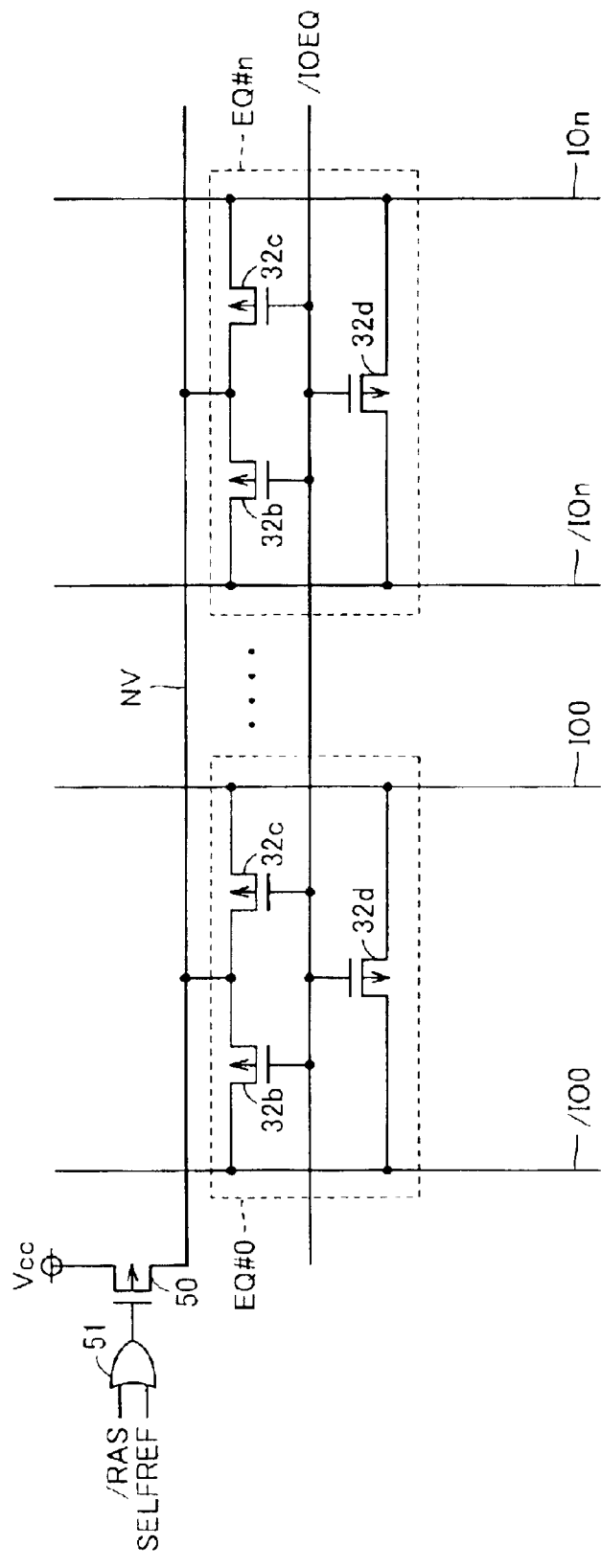

Referring to FIG. 32, each data line precharge/equalize circuit EQ# according to an eighth modification of the fifth embodiment differs from each data precharge/equalize circuit EQ# of the sixth modification of the fifth embodiment shown in FIG. 30 in that a signal determined by performing logical OR operation between row address strobe signal /RAS and self refresh signal SELFREF by an OR circuit 51 is supplied to the gate of P-channel MOS transistor 50 instead of row address strobe signal /RAS. Regarding other structural and functional details, data line precharge/equalize circuit EQ# of this eighth modification is the same as that of the sixth modification of the fifth embodiment and detailed description thereof is not repeated.

According to the eighth modification of the fifth embodiment, supply of the power supply voltage Vcc to each data line precharge/equalize circuit EQ# is stopped at the time of non data access and at the time when row address strobe signal /RAS or self refresh signal SELFREF has H level, namely in the standby period and the self refresh period. Thus, in the inactive period of column selection line CSL, particularly in the standby and self refresh periods, off leakage current in transistors TGa and TGb in read/write circuit RWG corresponding to each data line precharge/equalize circuit EQ# is shut off, as done by read data line precharge/equalize circuit EQ of the sixth modification of the first embodiment.

As discussed above, memory array MA# of common IO type according to the eighth modification of the fifth embodiment also achieves the effect of memory array MA# of the fifth modification of the fifth embodiment in the period except for the period in which row address strobe signal /RAS is set at L level and standby and self refresh periods.

Sixth Embodiment

Figure 33:
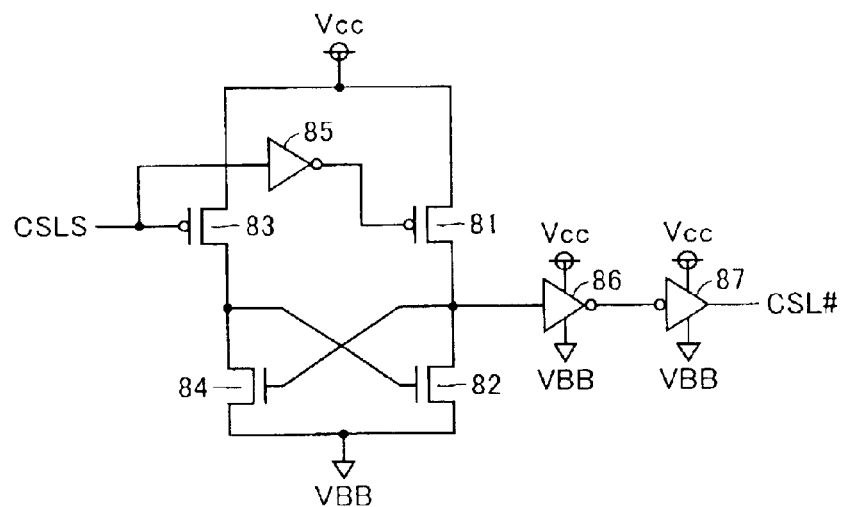
FIG. 33 is a circuit diagram showing a configuration of a signal level conversion circuit in the row/column decoder shown in FIG. 1 according to a sixth embodiment.

Referring to FIG. 33, a signal level conversion circuit 80# differs from signal level conversion circuit 80 shown in FIG. 15 in that column selection signal CSLS is supplied to the gate of P-channel MOS transistor 83 and inverter 85 instead of read column selection signal CSLRS and that column selection signal CSL# is provided from inverter 87 instead of read column selection signal CSLR#. Regarding other structural details, signal level conversion circuit 80# is the same as signal level conversion circuit 80 and detailed description thereof is not repeated.

Signal level conversion circuit 80# converts column selection signal CSLS into column selection signal CSL# and outputs the resultant signal CSL#. Then, H level and L level of column selection signal CSL# are set respectively at Vcc and negative voltage VBB.

Column selection signal CSL# of L level resultant from conversion by signal level conversion circuit 80# is supplied to column selection line CSL of sense amplifier structure circuit 300 shown in FIG. 23, and then negative voltage VBB is applied to respective gates of N-channel MOS transistors TGa and TGb in read/write circuit RWG. Accordingly, off leakage current in N-channel MOS transistors TGa and TGb is shut off. As sense amplifier structure circuit 300 is integrated in memory array MA#, the power consumption of memory array MA# is reduced. It is noted that the above-mentioned effect is also achieved if column selection signal CSL# of L level is supplied to column selection line CSL in the sense amplifier structure circuit of common IO type as described below.

As discussed above, the reduced power consumption of the semiconductor memory device is achieved by supplying column selection signal CSL# of negative voltage VBB to column selection line CSL of memory array MA# of common IO type according to the sixth embodiment.

Seventh Embodiment

Figure 34:
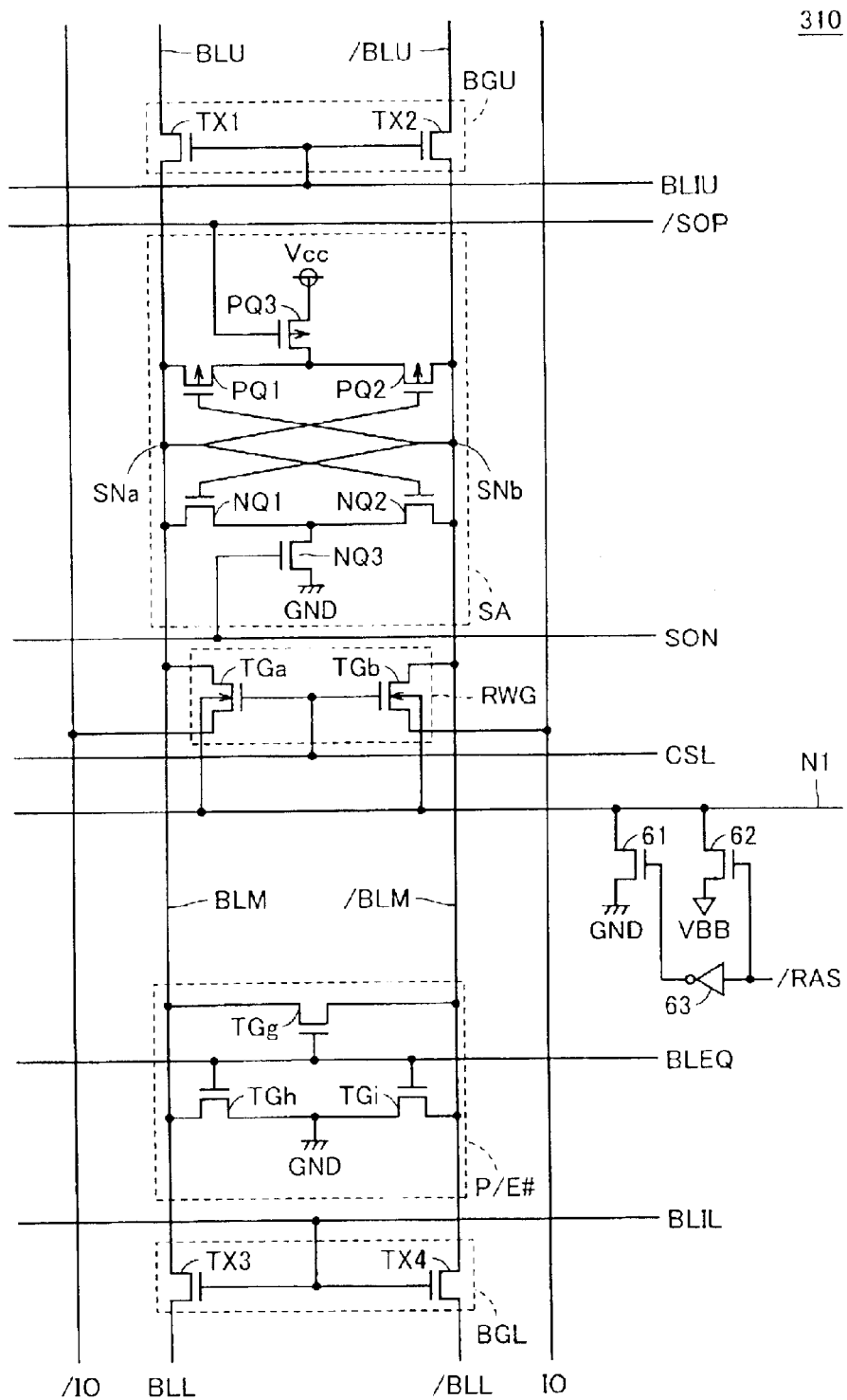
FIG. 34 is a circuit diagram showing a configuration of a sense amplifier structure circuit of common IO type in the sense amplifier band shown in FIG. 22 according to a seventh embodiment.

Referring to FIG. 34, a sense amplifier structure circuit 310 according to a seventh embodiment differs from sense amplifier structure circuit 300 according to the fifth embodiment shown in FIG. 23 in that the former circuit additionally includes N-channel MOS transistors 61 and 62 and an inverter 63.

Sense amplifier structure circuit 310 further differs from sense amplifier structure circuit 300 in that the back gates of N-channel MOS transistors TGa and TGb in read/write circuit RWG are connected to node N1, that N-channel MOS transistor 61 is provided between node N1 and ground voltage GND and that N-channel MOS transistor 62 is provided between node N1 and negative voltage VBB.

Moreover, sense amplifier structure circuit 310 differs from sense amplifier structure circuit 300 in that row address strobe signal /RAS is supplied to the gate of N-channel MOS transistor 62 and that a signal having the level resultant from inversion of the level of row address strobe signal /RAS by inverter 63 is supplied to the gate of N-channel MOS transistor 61. Regarding other structural details, sense amplifier structure circuit 310 is the same as sense amplifier structure circuit 300 shown in FIG. 23 and detailed description thereof is not repeated. The voltage at L level of row address strobe signal /RAS supplied to the gate of N-channel MOS transistor 62 is set at negative voltage VBB by a voltage level conversion circuit (not shown).

Accordingly, in the period in which row address strobe signal /RAS is set at L level, sense amplifier structure circuit 310 sets the voltage on the back gates of N-channel MOS transistors TGa and TGb at ground voltage GND. On the other hand, at the time of non data access and in the period in which row address strobe signal /RAS is set at H level, namely in the self refresh period except for the period in which row address strobe signal /RAS is set at L level and in the standby period, the voltage on the back gates of N-channel MOS transistors TGa and TGb is set at negative voltage VBB. As the voltage on the back gates of N-channel MOS transistors TGa and TGb is set at negative voltage VBB, the threshold of N-channel MOS transistors TGa and TGb increases to shut off the off leakage current in N-channel MOS transistors TGa and TGb. Thus, sense amplifier structure circuit 310 reduces the power consumption of memory array MA# as sense amplifier structure circuit 310 is integrated in memory array MA# of common IO type.

As discussed above, in memory array MA# of common IO type according to the seventh embodiment, the voltage on the back gates of N-channel MOS transistors TGa and TGb is set at negative voltage VBB in the self refresh period except for the period in which row address strobe signal /RAS is set at L level and in the standby period, which accordingly achieves the lower power consumption of the semiconductor memory device.

First Modification of Seventh Embodiment

Figure 35:
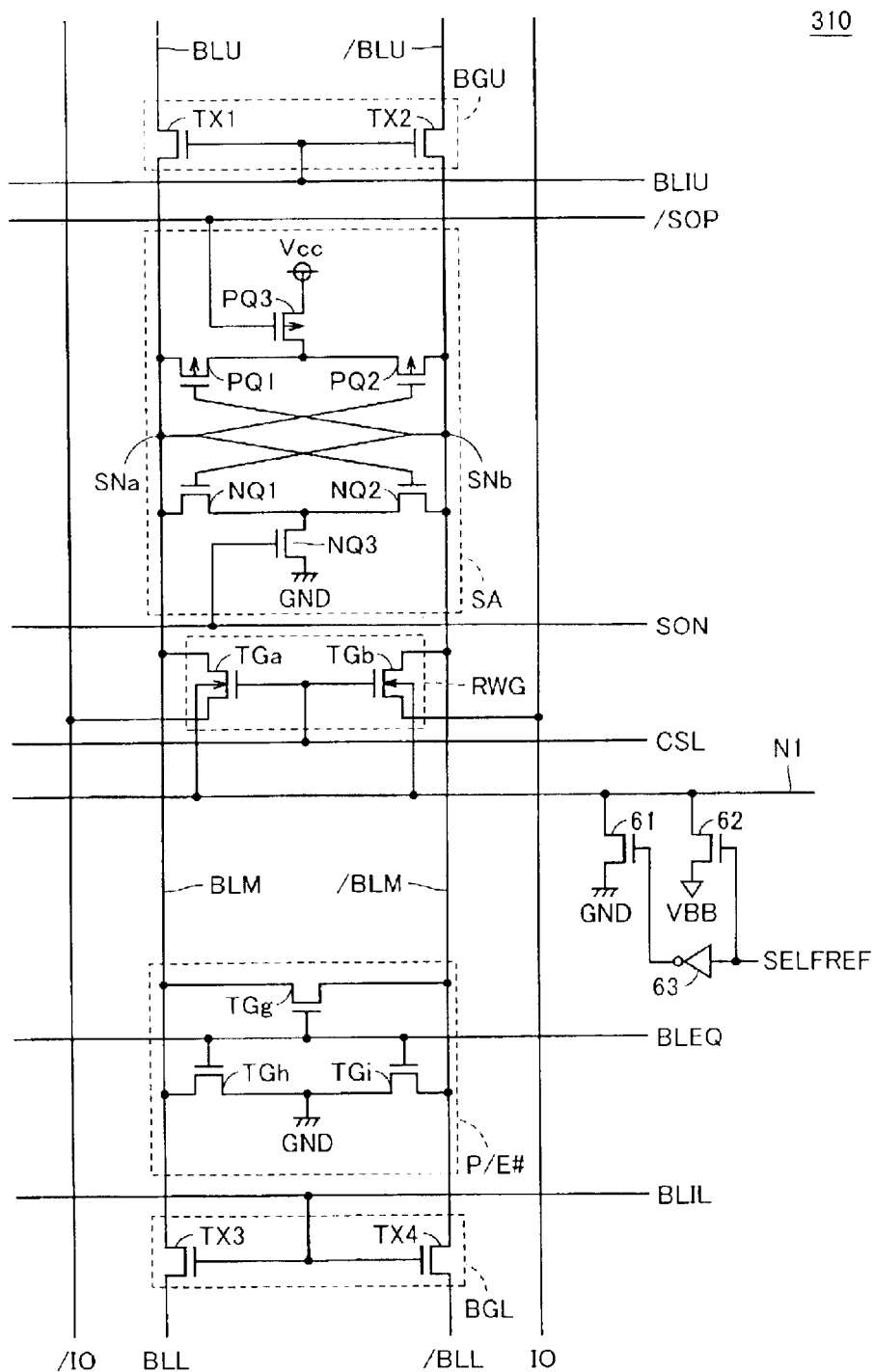
FIGS. 35 and 36 are circuit diagrams showing respective configurations of sense amplifier structure circuits of common IO type in the sense amplifier band shown in FIG. 22 according respectively to first and second modifications of the seventh embodiment.

Referring to FIG. 35, a sense amplifier structure circuit 310 according to a first modification of the seventh embodiment differs from that of the seventh embodiment shown in FIG. 34 in that self refresh signal SELFREF is supplied to inverter 63 and the gate of N-channel MOS transistor 62 instead of row address strobe signal /RAS. Regarding other structural and functional details, sense amplifier structure circuit 310 of this first modification is the same as that of the seventh embodiment and detailed description thereof is not repeated. The voltage of L level of self refresh signal SELFREF supplied to the gate of N-channel MOS transistor 62 is set at negative voltage VBB by a voltage level conversion circuit (not shown).

According to the first modification of the seventh embodiment, the voltage on the back gates of N-channel MOS transistors TGa and TGb is set at negative voltage VBB at the time of non data access and at the time when self refresh signal SELFREF has H level, namely in the self refresh period. Thus, off leakage current in N-channel MOS transistors TGa and TGb is shut off. As sense amplifier structure circuit 310 is integrated in memory array MA# of common IO type, the power consumption of memory array MA# is reduced.

As discussed above, memory array MA# of common IO type according to the first modification of the seventh embodiment also achieves, the effect of memory array MA# in the self refresh period of the seventh embodiment.

Second Modification of Seventh Embodiment

Figure 36:
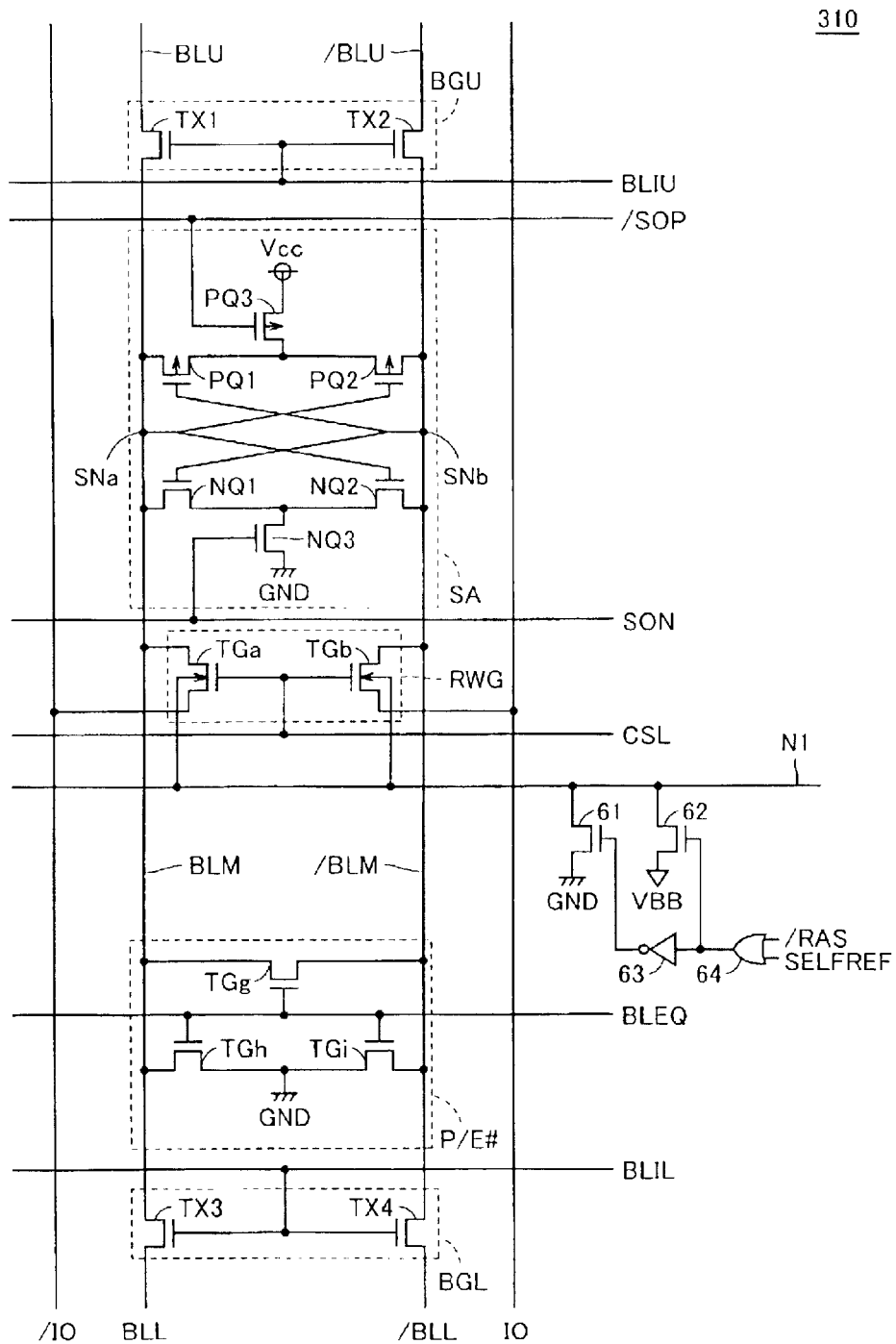
Figure 37:
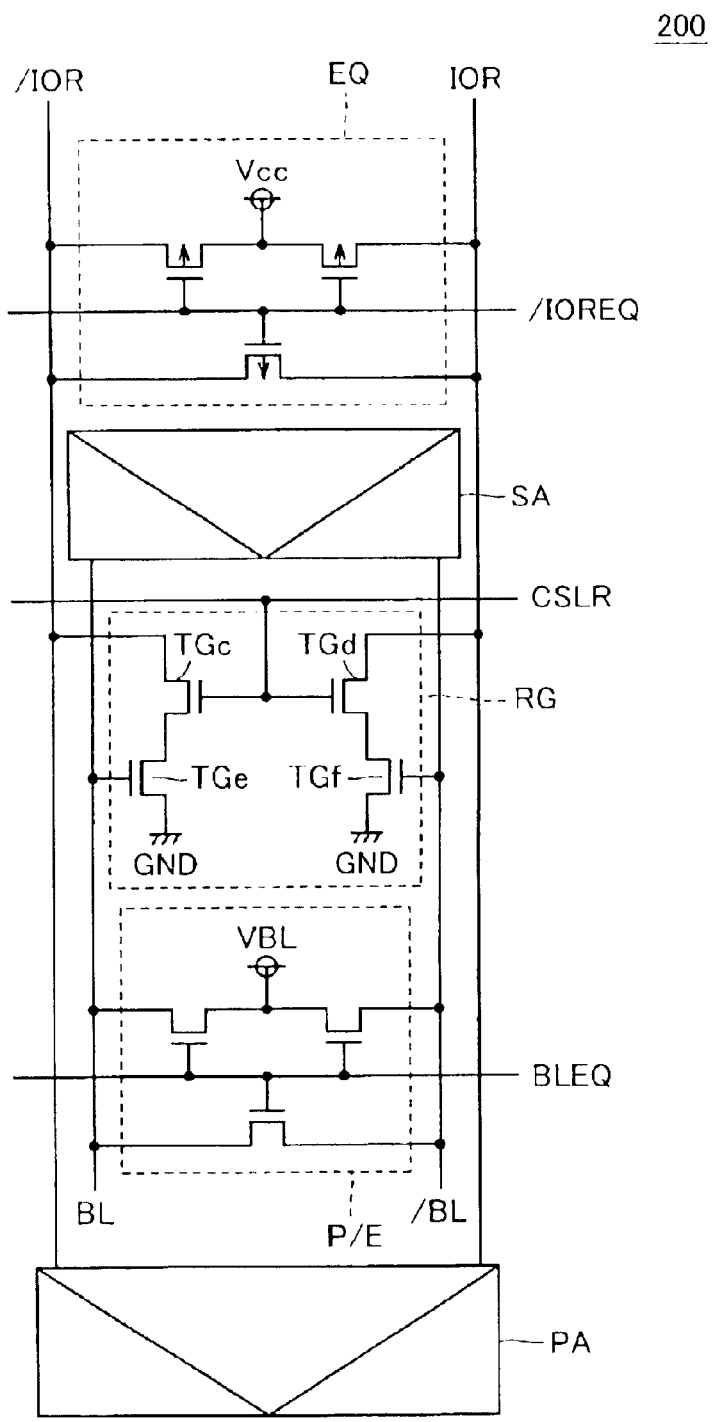
FIG. 37 is a circuit diagram showing a configuration of a data read circuit of separate IO type that is integrated in a DRAM.

Referring to FIG. 36, a sense amplifier structure circuit 310 according to a second modification of the seventh embodiment differs from that of the seventh embodiment shown in FIG. 34 in that a signal determined by performing OR operation between row address strobe signal /RAS and self refresh signal SELFREF by an OR circuit 64 is supplied to inverter 63 and the gate of N-channel MOS transistor 62 instead of row address strobe signal /RAS. Regarding other structural and functional details, sense amplifier structure circuit of this modification is the same as that of the seventh embodiment and detailed description thereof is not repeated. The voltage of L level of row address strobe signal /RAS and self refresh signal SELFREF supplied to or circuit 64 is set at negative voltage VBB by a voltage level conversion circuit (not shown). The voltage of L level of the output signal from OR circuit 64 is thus set at negative voltage VBB.

According to the second modification of the seventh embodiment, the voltage on the back gates of N-channel MOS transistors TGa and TGb is set at negative voltage VBB at the time of non data access and at the time when row address strobe signal /RAS or self refresh signal SELREF has H level, namely in the standby and refresh periods. Accordingly, off leakage current in N-channel MOS transistors TGa and TGb is shut off. As sense amplifier structure circuit 310 is integrated in memory array MA# of common IO type, the reduced power consumption of memory array MA# is accomplished.

As discussed above, memory array MA# of common IO type according to the second modification of the seventh embodiment also achieves the effect of memory array MA# of the seventh embodiment in the standby period and self refresh period.

The structure having the DRAM integrated on the system LSI has exemplarily been illustrated in connection with the first to seventh embodiments, however, the present invention is not limited to such a structure and is applicable to the DRAM itself as well.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a plurality of memory cells;
a first data line electrically connected to selected one of said plurality of memory cells in response to activation of a word line;
a second data line hierarchically provided with respect to said first data line;
a read circuit provided between said first data line and said second data line to drive said second data line to a fixed voltage with a driving power according to a voltage on said first data line at the time of data reading; and
a voltage supply control circuit for supplying a predetermined voltage to said second data line in response to a precharge/equalize instruction,
said voltage supply control circuit including a voltage supply stop circuit disconnecting said second data line from said predetermined voltage in a predetermined period except for said time of data reading.

2. The semiconductor memory device according to claim 1, wherein
said voltage supply stop circuit includes
a power supply node supplying said predetermined voltage, and
a switch provided between said power supply node and said second data line to electrically connect said power supply node and said second data line when said precharge/equalize instruction is issued, and
said switch electrically disconnects said power supply node from said second data line in response to at least one of a first control signal and a second control signal respectively defining a first period and a second period included in said predetermined period.

3. The semiconductor memory device according to claim 2, wherein
said first control signal is a row address strobe signal or self refresh signal and said second control signal is a precharge/equalize signal.

4. A semiconductor memory device comprising:
a plurality of memory cells;
a first data line electrically connected to selected one of said plurality of memory cells in response to activation of a word line;
a second data line hierarchically provided with respect to said first data line;
a switch circuit provided between said first data line and said second data line to electrically connect said first data line and said second data line at the time of data access; and
a voltage supply control circuit for supplying a predetermined voltage to said second data line in response to a precharge/equalize instruction,
said voltage supply control circuit including a voltage supply stop circuit disconnecting said second data line from said predetermined voltage in a predetermined period except for said time of data access.

5. The semiconductor memory device according to claim 4, wherein
said voltage supply stop circuit includes
a power supply node supplying said predetermined voltage, and
a switch provided between said power supply node and said second data line to electrically connect said power supply node and said second data line when said precharge/equalize instruction is issued, and
said switch electrically disconnects said power supply node from said second data line in response to at least one of a first control signal and a second control signal respectively defining a first period and a second period included in said predetermined period.

6. The semiconductor memory device according to claim 5, wherein
said first control signal is a row address strobe signal or self refresh signal and said second control signal is a precharge/equalize signal.

7. A semiconductor memory device comprising:
a plurality of memory cells;
a plurality of first data lines;
a plurality of second data lines hierarchically provided with respect to said plurality of first data lines respectively;
a plurality of read circuits respectively provided between said plurality of first data lines and said plurality of second data lines to drive said second data lines corresponding respectively to said plurality of first data lines to a fixed voltage with a driving power according to respective voltages on said plurality of first data lines at the time of data reading;
a power supply node supplying a predetermined voltage;
a voltage supply line;
a voltage supply stop circuit provided between said power supply node and said voltage supply line to electrically connect said power supply node and said voltage supply line at said time of data reading; and
a plurality of voltage supply control circuits provided correspondingly to said plurality of second data lines respectively for electrically connecting said voltage supply line and said plurality of second data lines in response to a precharge/equalize instruction,
said voltage supply stop circuit disconnecting said power supply node from said voltage supply line in a predetermined period except for said time of data reading, and
selected one of said plurality of first data lines being electrically connected to selected one of said plurality of memory cells in response to activation of a word line.

8. The semiconductor memory device according to claim 7, wherein
said voltage supply stop circuit includes a first switch provided between said power supply node and said voltage supply line,
said plurality of voltage supply control circuits each include a second switch provided between a corresponding second data line and said voltage supply line,
said first switch electrically disconnects said power supply node from said voltage supply line in response to a first control signal defining a first period included in said predetermined period, and said second switch electrically connects a corresponding second data line and said voltage supply line when said precharge/equalize instruction is issued and electrically disconnects said corresponding second data line from said voltage supply line in response to a second control signal defining a second period included in said predetermined period.

9. The semiconductor memory device according to claim 8, wherein
said first control signal is a row address strobe signal or self refresh signal and said second control signal is a precharge/equalize signal.

* * * * *